US009064890B1

(12) United States Patent
Xie et al.

(10) Patent No.: US 9,064,890 B1
(45) Date of Patent: Jun. 23, 2015

(54) METHODS OF FORMING ISOLATION MATERIAL ON FINFET SEMICONDUCTOR DEVICES AND THE RESULTING DEVICES

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/223,545

(22) Filed: Mar. 24, 2014

(51) Int. Cl.
*H01L 29/66* (2006.01)
*H01L 21/8238* (2006.01)

(52) U.S. Cl.
CPC ... *H01L 29/66545* (2013.01); *H01L 21/823807* (2013.01)

(58) Field of Classification Search
CPC ............ H01L 29/785; H01L 29/66795; H01L 29/66545; H01L 21/76364; H01L 21/823807; H01L 21/823878
See application file for complete search history.

(56) References Cited

U.S. PATENT DOCUMENTS

| 7,456,471 | B2 * | 11/2008 | Anderson et al. | 257/331 |
| 8,043,920 | B2 * | 10/2011 | Chan et al. | 438/300 |
| 2005/0224880 | A1 * | 10/2005 | Lee et al. | 257/347 |
| 2007/0272925 | A1 * | 11/2007 | Choi et al. | 257/51 |
| 2012/0043610 | A1 * | 2/2012 | Cheng et al. | 257/347 |
| 2014/0027863 | A1 * | 1/2014 | Adam et al. | 257/410 |

* cited by examiner

Primary Examiner — Nikolay Yushin
(74) Attorney, Agent, or Firm — Amerson Law Firm, PLLC

(57) ABSTRACT

One method disclosed includes, among other things, forming an initial fin, covering a top surface and a portion of the sidewalls of the initial fin structure with etch stop material, forming a sacrificial gate structure above and around the initial fin structure, forming a sidewall spacer adjacent the sacrificial gate structure, performing at least one process operation to remove the sacrificial gate structure and thereby define a replacement gate cavity, performing at least one etching process through the replacement gate cavity to remove a portion of the initial fin structure so as to thereby define a final fin structure and a channel cavity positioned below the final fin structure, and substantially filling the channel cavity with an insulating material.

18 Claims, 24 Drawing Sheets

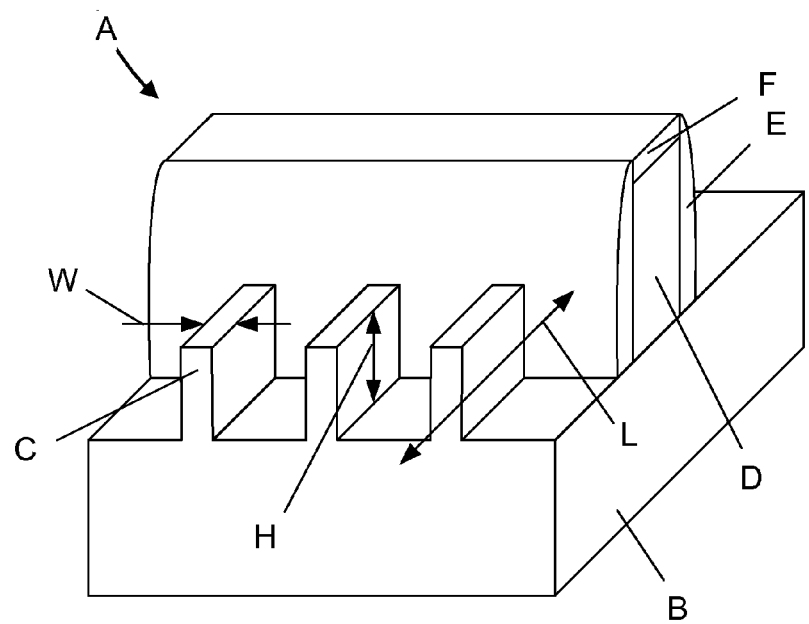
Figure 1A (Prior Art)
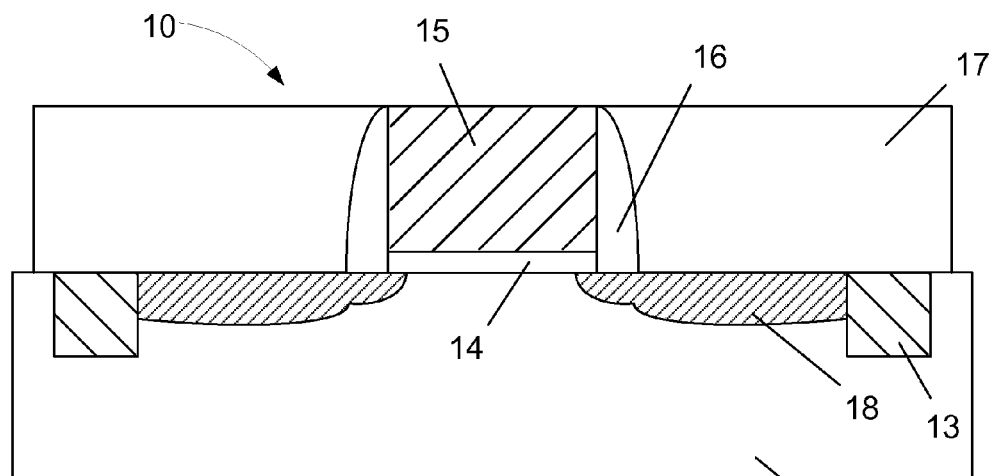
(Prior Art) Figure 1B

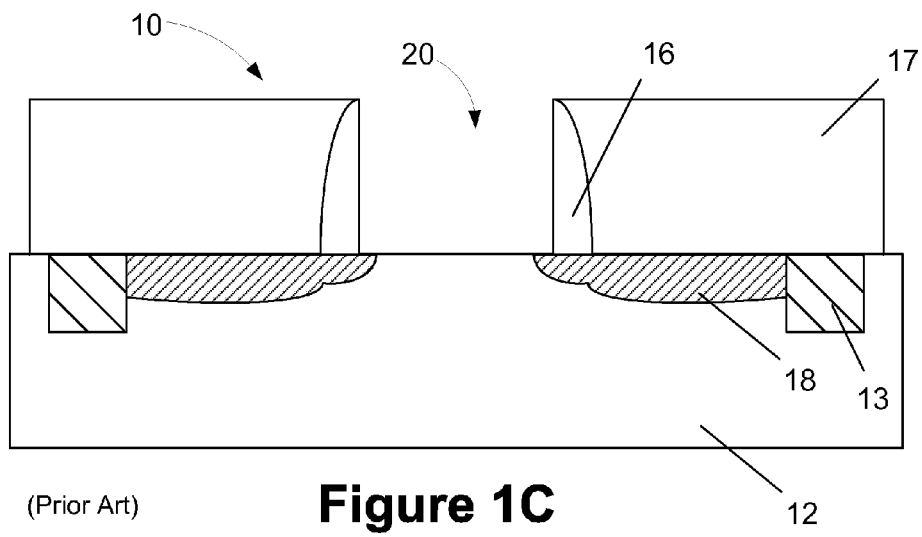
(Prior Art) Figure 1C
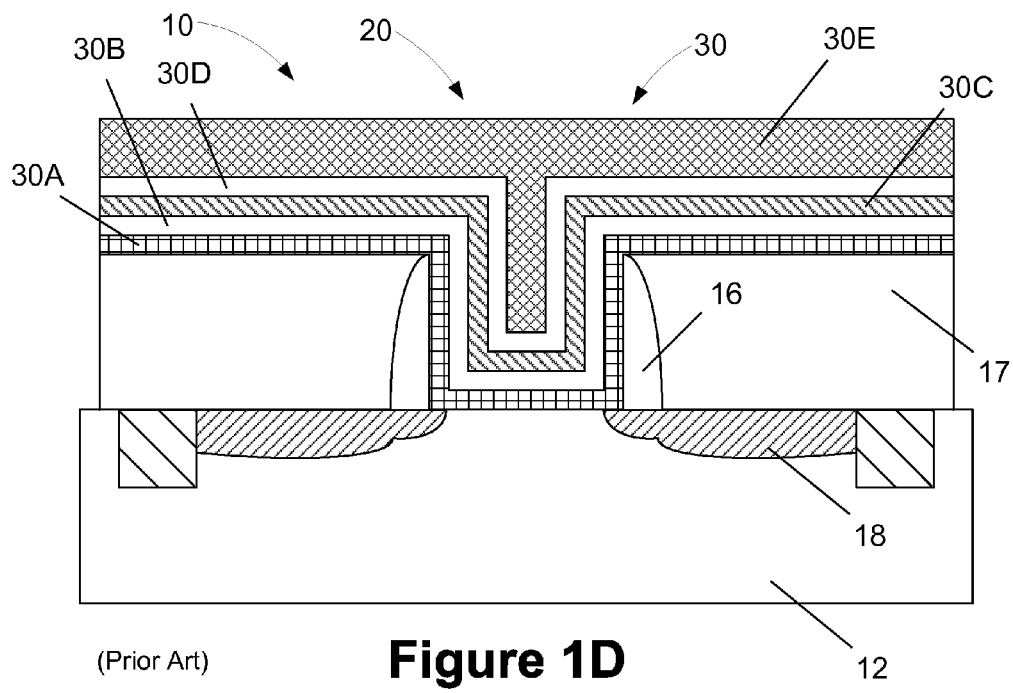
(Prior Art) Figure 1D

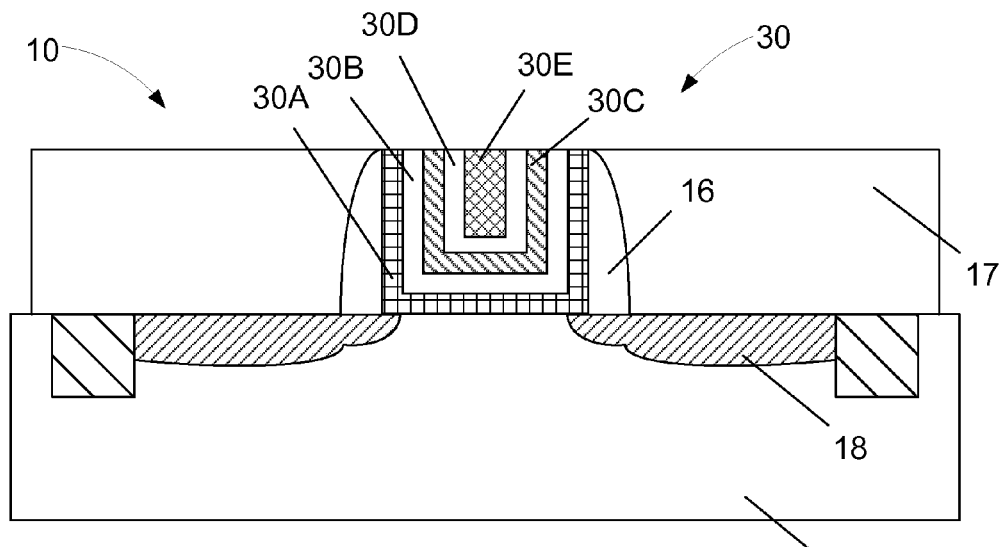
(Prior Art) Figure 1E
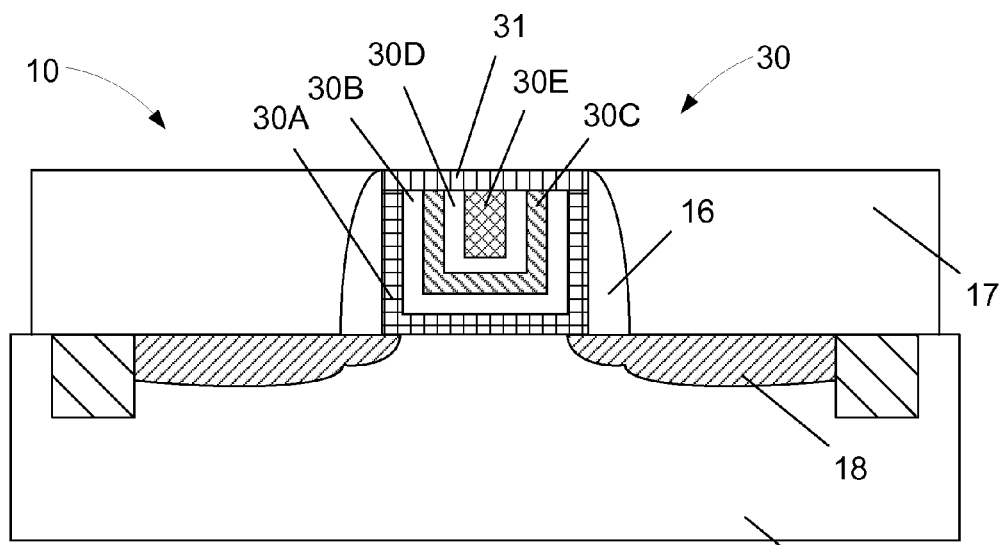
(Prior Art) Figure 1F

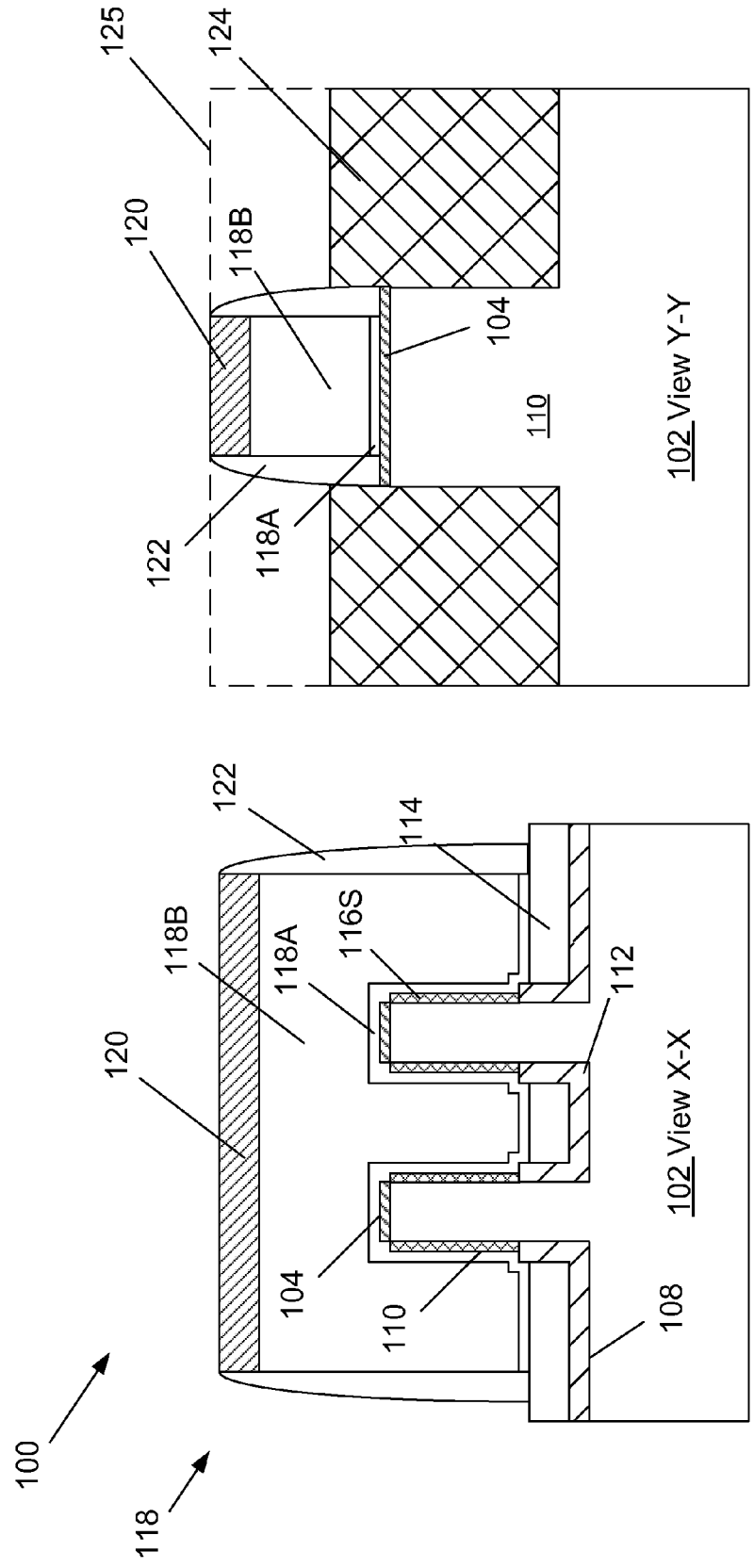

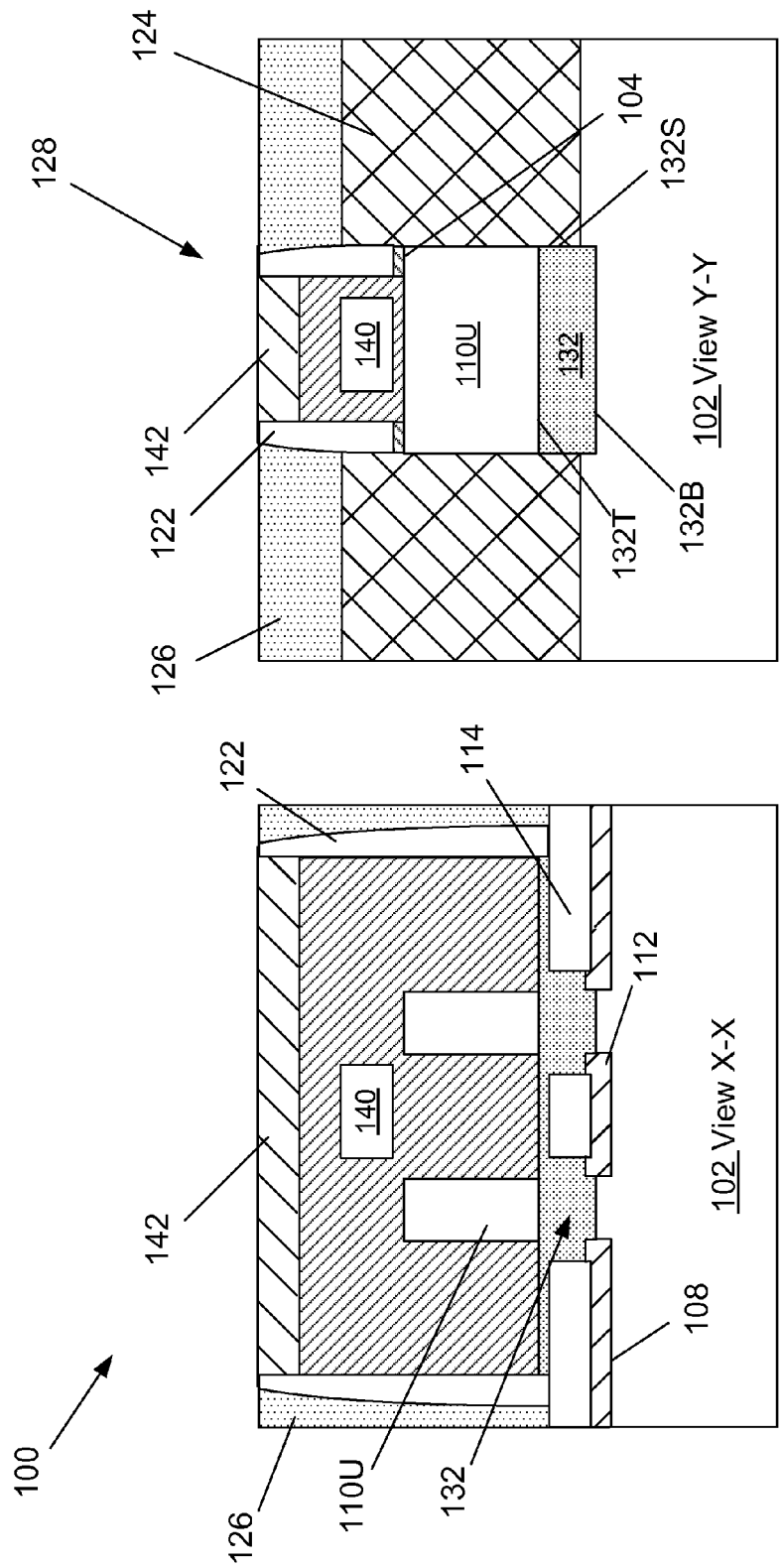

METHODS OF FORMING ISOLATION MATERIAL ON FINFET SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of forming isolation material on a FinFET semiconductor device and the resulting semiconductor device.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate-last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconductor substrate 12 in an active area defined by a shallow trench isolation structure 13. At the point of fabrication depicted in FIG. 1B, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more recess etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

One problem that is encountered in forming FinFET devices relates to preventing leakage currents underneath the fin structures. This is sometimes referred to as so-called "punch through" leakage currents. One prior art effort to eliminate or reduce such undesirable punch through leakage currents involved forming counter-doped regions that were positioned at approximately the intersection between the fin and the remaining portion of the substrate. However, obtaining an accurate doping profile that is properly positioned underneath the active fin is very difficult to accomplish, especially given that the additional thermal heating processes that are involved in subsequent process steps will further drive dopant diffusion and make it harder to control the location of the anti-punch-through doping. If dopant diffuses into the fins during subsequent annealing processes, it would cause threshold voltage fluctuation because of the random amount of the dopant diffused into the fins of different devices, which would severely compromise the circuit performance. Additionally, fabrication of FinFET devices may involve formation of stressed layers of insulation material in an effort to induce a desired stress on the channel region of the FinFET device, e.g., a tensile stress for N-type FinFET devices and a compressive stress for P-type FinFET devices. Such stressed channel regions are formed in an effort to improve the electrical performance characteristics of the N-type and P-type FinFET devices. Thus, an effort at reducing the undesirable punch through leakage currents must not unduly detract from the benefits achieved by virtue of the formation of the stressed materials that induce the desired stress in the channel region of the FinFET devices.

The present disclosure is directed to various methods of forming isolation material on a FinFET semiconductor device and the resulting semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation material on a FinFET semiconductor device and the resulting semiconductor device. One illustrative method disclosed includes, among other things, forming an initial fin structure from a semiconductor substrate material, covering a top surface and a portion of the sidewalls of the initial fin structure with etch stop material, after forming the etch stop material, forming a sacrificial gate structure above and around the initial fin structure, forming a sidewall spacer adjacent the sacrificial gate structure, performing at least one process operation to remove the sacrificial gate structure and thereby define a replacement gate cavity, wherein the etch stop material on the initial fin structure remains positioned on the initial fin structure while the sacrificial gate structure is removed, performing at least one etching process through the replacement gate cavity to remove a portion of the initial fin structure positioned under the replacement gate cavity that is not covered by the etch stop material so as to thereby define a final fin structure and a channel cavity positioned below the final fin structure, and substantially filling the channel cavity with an insulating material.

Another illustrative method disclosed herein includes, among other things, forming an initial fin structure from a semiconductor substrate material, covering a top surface and a portion of the sidewalls of the initial fin structure with etch stop material, after forming the etch stop material, forming a sacrificial gate structure above and around the initial fin structure, forming a sidewall spacer adjacent the sacrificial gate structure, after forming the sidewall spacer, performing an epitaxial deposition process to form an epi semiconductor material on the initial fin structure that is positioned laterally outside of the sidewall spacer, after forming the epi semiconductor material, performing at least one process operation to remove the sacrificial gate structure and thereby define a replacement gate cavity, wherein the etch stop material on the initial fin structure remains positioned on the initial fin structure while the sacrificial gate structure is removed, performing at least one etching process through the replacement gate cavity to remove a portion of the initial fin structure positioned under the replacement gate cavity that is not covered by the etch stop material so as to thereby define a final fin structure and a channel cavity positioned below the final fin structure, wherein the etch stop material remains positioned on the final fin structure while the at least one etching process is performed to define the final fin structure and the channel cavity, and substantially filling the channel cavity with an insulating material.

One illustrative FinFET device disclosed herein includes, among other things, a substrate comprised of a semiconductor material, a gate structure positioned above the substrate, sidewall spacers positioned adjacent the gate structure, an epi semiconductor material positioned in the source/drain regions of the FinFET device laterally outside of the sidewall spacers, a fin that extends laterally under the gate structure and the sidewall spacers in a gate length direction of the FinFET device, wherein end surfaces of the fin abut and engage the epi semiconductor material and an insulating material that is positioned below the fin, above the substrate and laterally between the epi semiconductor material, wherein a top surface of the insulating material abuts and engages a bottom surface of the fin, a bottom surface of the insulating material abuts and engages the substrate, and side surfaces of the insulating material abut and engage at least a portion of the epi semiconductor material.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure of the transistors using a so-called "replacement gate" technique.

Figure 2A:
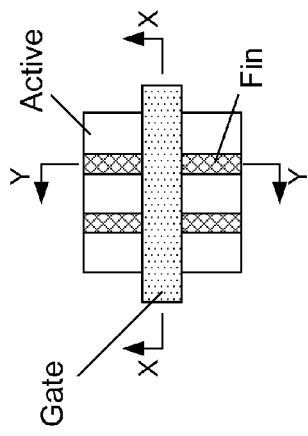
FIGS. 2A-2U depict one illustrative method disclosed herein of forming isolation material on a FinFET semiconductor device and the resulting semiconductor device.
Figure 2A:
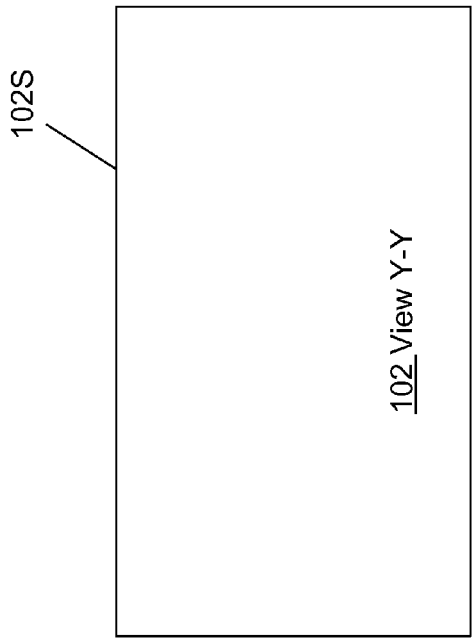
Figure 2A:
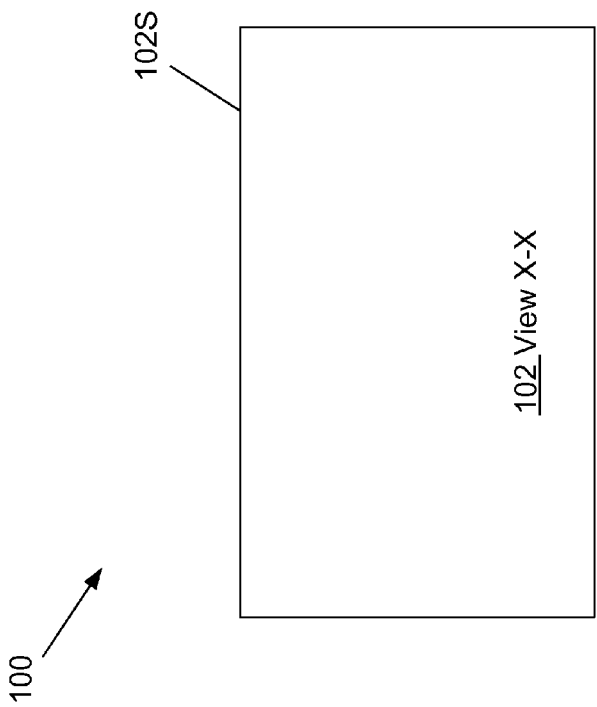

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming isolation material on a FinFET semiconductor device and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. Of course, the inventions disclosed herein should not be considered to be limited to the illustrative examples depicted and described herein. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. Additionally, various doped regions, e.g., source/drain regions, halo implant regions, well regions and the like, are not depicted in the attached drawings. The substrate 102 may be made of silicon or it may be made of materials other than silicon. In other embodiments, the device 100 may be formed on a so-called silicon-on-insulator (SOI) substrate, as described more fully below. Thus, the terms "substrate" or "semiconductor substrate" should be understood to cover all semiconducting materials and all forms of such materials.

The attached drawings present various views of one illustrative embodiment of a FinFET device 100 that may be formed using the methods disclosed herein. FIG. 2A contains a simplistic plan view of the device 100 (in the upper right corner) that depicts the location where various cross-sectional views depicted in the following drawings will be taken. More specifically, the view "X-X" is a cross-sectional view that is taken through the gate structure of the device in the gate-width direction, and the view "Y-Y" is a cross-sectional view that is taken through the long axis of one of the fins of the device (i.e., in the current transport or gate-length direction of the device). The illustrative FinFET device 100 disclosed herein will be depicted as being comprised of two illustrative fins 110. However, as will be recognized by those skilled in the art after a complete reading of the present application, the methods and devices disclosed herein may be employed when manufacturing FinFET devices having any number of fins. The various layers of material depicted in the following drawings may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIG. 2A depicts the starting substrate 102 having an upper surface 102S.

Figure 2B:
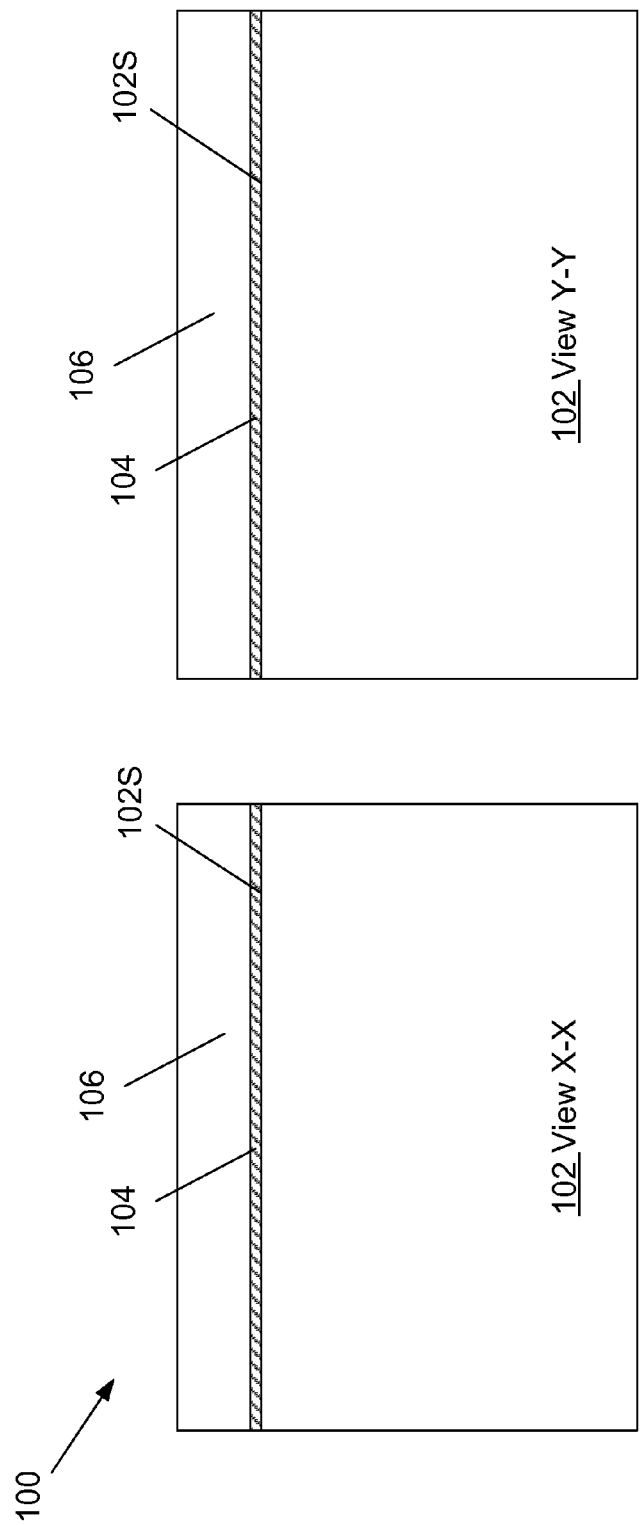

FIG. 2B depicts the device 100 at a point in fabrication wherein several process operations have been performed. First, an etch stop layer 104 was deposited above the substrate 102. Next, a hard mask layer 106 was deposited above the etch stop layer 104. In one example, the hard mask layer 106 may be a layer of silicon nitride. In one embodiment, the etch stop layer 104 may be comprised of a high-k material (k value of 10 or greater), such as hafnium oxide. The thickness of the etch stop layer 104 and the hard mask layer 106 may vary depending upon the particular application.

Figure 2C:
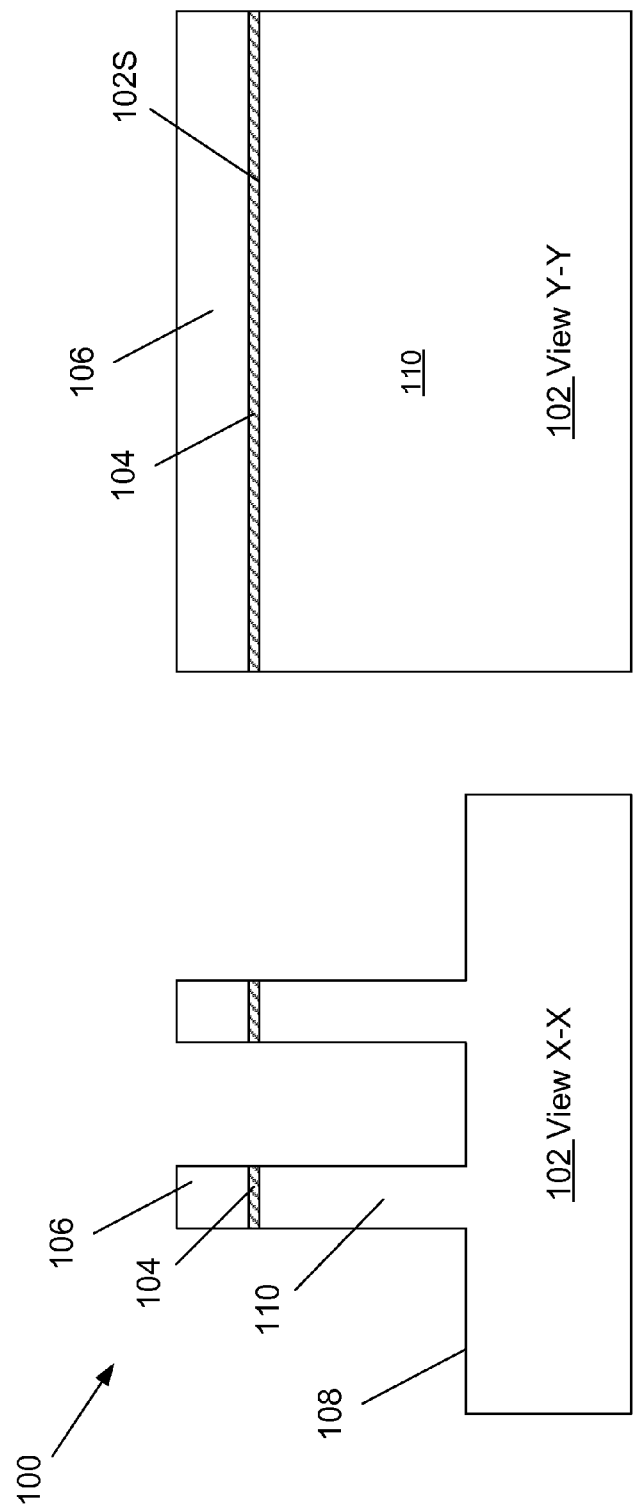

FIG. 2C depicts the device 100 after several additional process operations were performed. First, the hard mask layer 106 and the etch stop layer 104 were patterned using traditional photolithography and etching processes. FIG. 2C depicts the device after the patterned photoresist mask was removed. Then, one or more etching processes, e.g., anisotropic etching processes, were performed through the patterned layers 106/104 to define a plurality of trenches 108 in the substrate 102. The formation of the trenches 108 results in the formation of a plurality of initial fin structures 110. The width and height of the fin structures 110 as well as the depth of the trenches 108 may vary depending upon the particular application. Additionally, the overall size, shape and configuration of the trenches 108 and fins 110 may vary depending on the particular application. In the illustrative examples depicted in most of the attached drawings, the fin-formation trenches 108 and fins 110 are all depicted as having a uniform size and shape. However, such uniformity in the size and shape of the fin-formation trenches 108 and the fins 110 is not required to practice at least some aspects of the inventions disclosed herein. In the attached figures, the fin-formation trenches 108 are depicted as having been formed by performing an anisotropic etching process that results in the fin-formation trenches 108 having a schematically depicted, generally rectangular configuration. In an actual real-world device, the sidewalls of the fin-formation trenches 108 may be somewhat inwardly tapered, although that configuration is not depicted in the attached drawings. In some cases, the fin-formation trenches 108 may have a reentrant profile (not shown) near the bottom of the fin-formation trenches 108. To the extent the fin-formation trenches 108 are formed by performing a wet etching process, the fin-formation trenches 108 may tend to have a more rounded configuration or non-linear configuration as compared to the generally rectangular configuration of the fin-formation trenches 108 that are formed by performing an anisotropic etching process. Thus, the size and configuration of the fin-formation trenches 108, and the manner in which they are made, as well as the general configuration of the fins 110, should not be considered a limitation of the present invention. For ease of disclosure, only the substantially rectangular fin-formation trenches 108 and fins 110 will be depicted in the subsequent drawings.

Figure 2D:
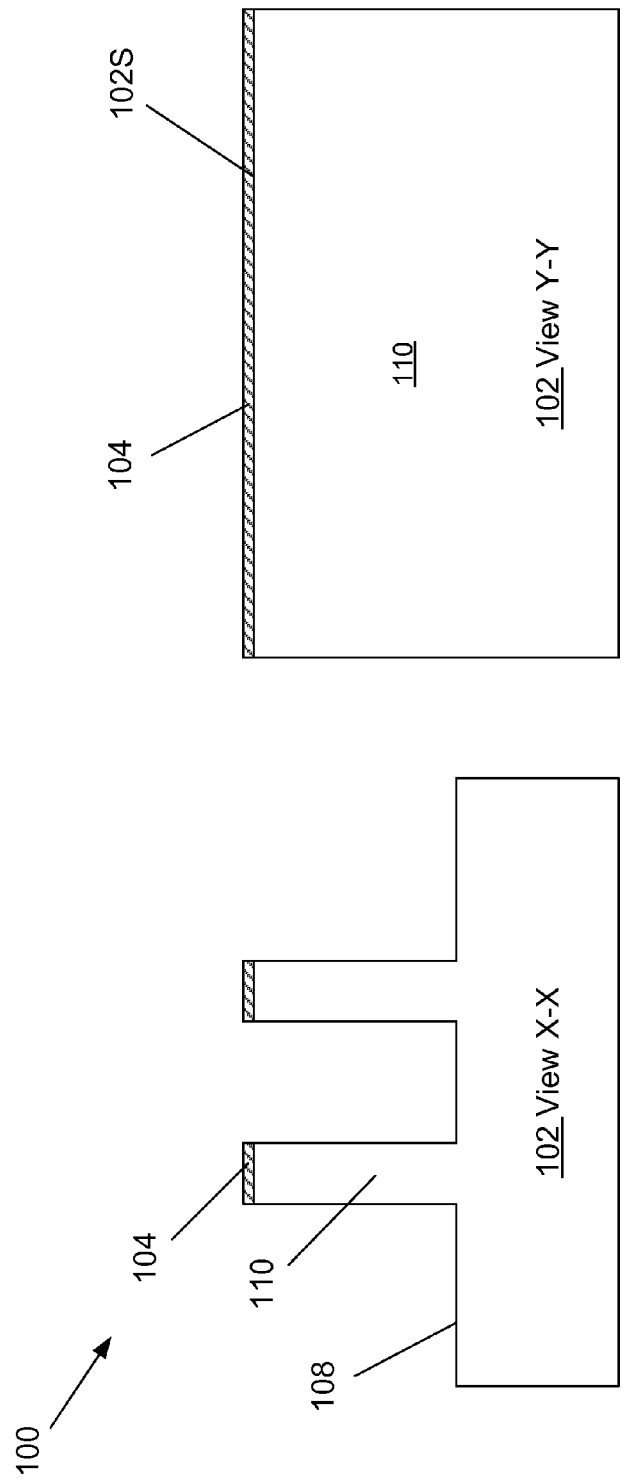

FIG. 2D depicts the device 100 after the hard mask layer 106 was removed from the device selectively relative to the etch stop layer 104.

Figure 2E:
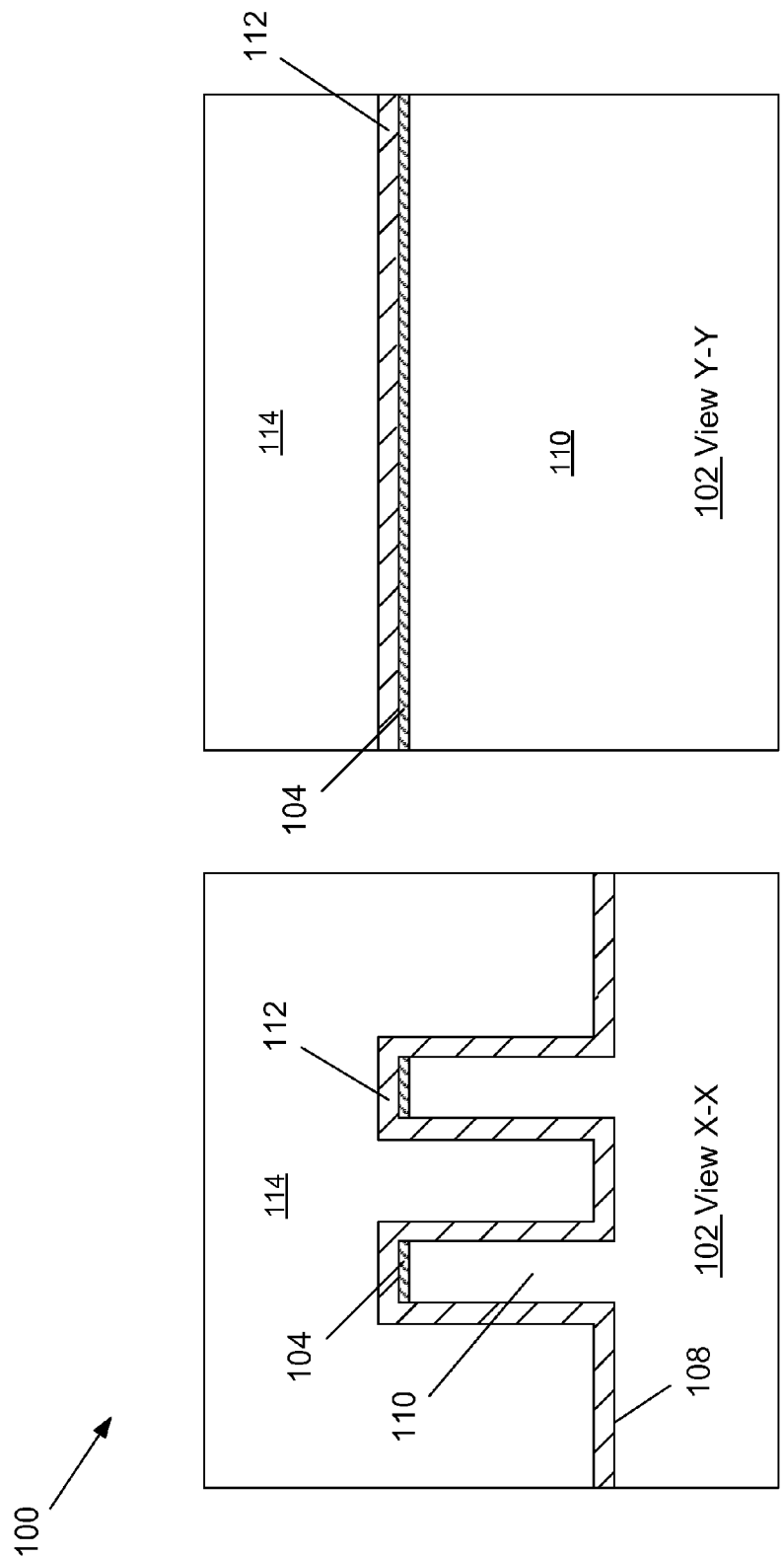

FIG. 2E depicts the device 100 after several process operations were performed. First, a liner layer 112 was formed on the device by performing a conformal deposition process. In one illustrative embodiment, the liner layer 112 may be a layer of silicon nitride that has a thickness of about 5-10 nm. Next, a layer of insulating material 114 was blanket-deposited on the device 100. In one illustrative example, the layer of insulating material 114 may be a layer of silicon dioxide, an oxygen-rich silicon dioxide, etc., and it may be formed by performing a chemical vapor deposition (CVD) process.

Figure 2F:
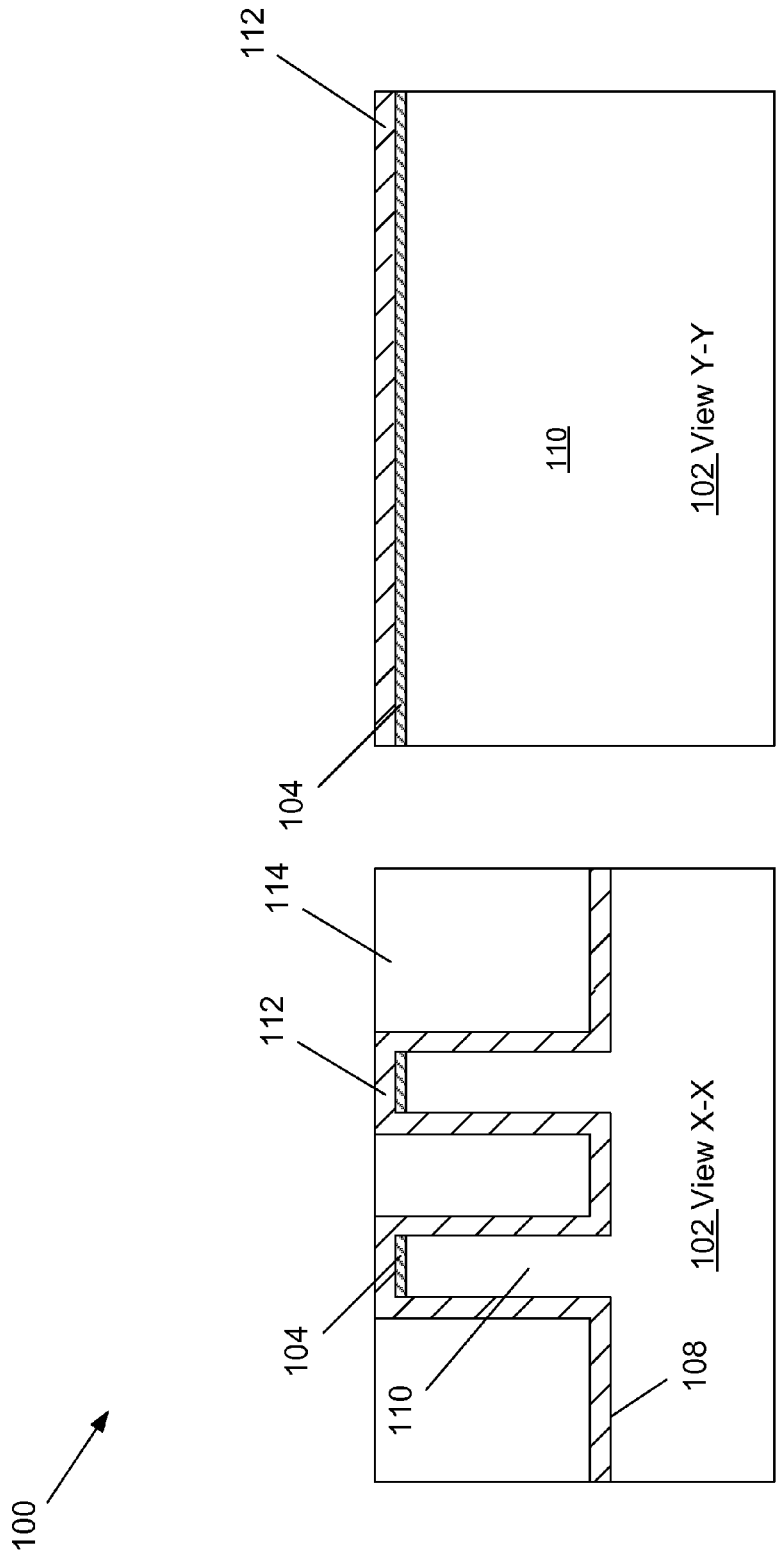

FIG. 2F depicts the device 100 after a chemical mechanical polishing (CMP) process was performed using the liner layer 112 as a polish stop layer.

Figure 2G:
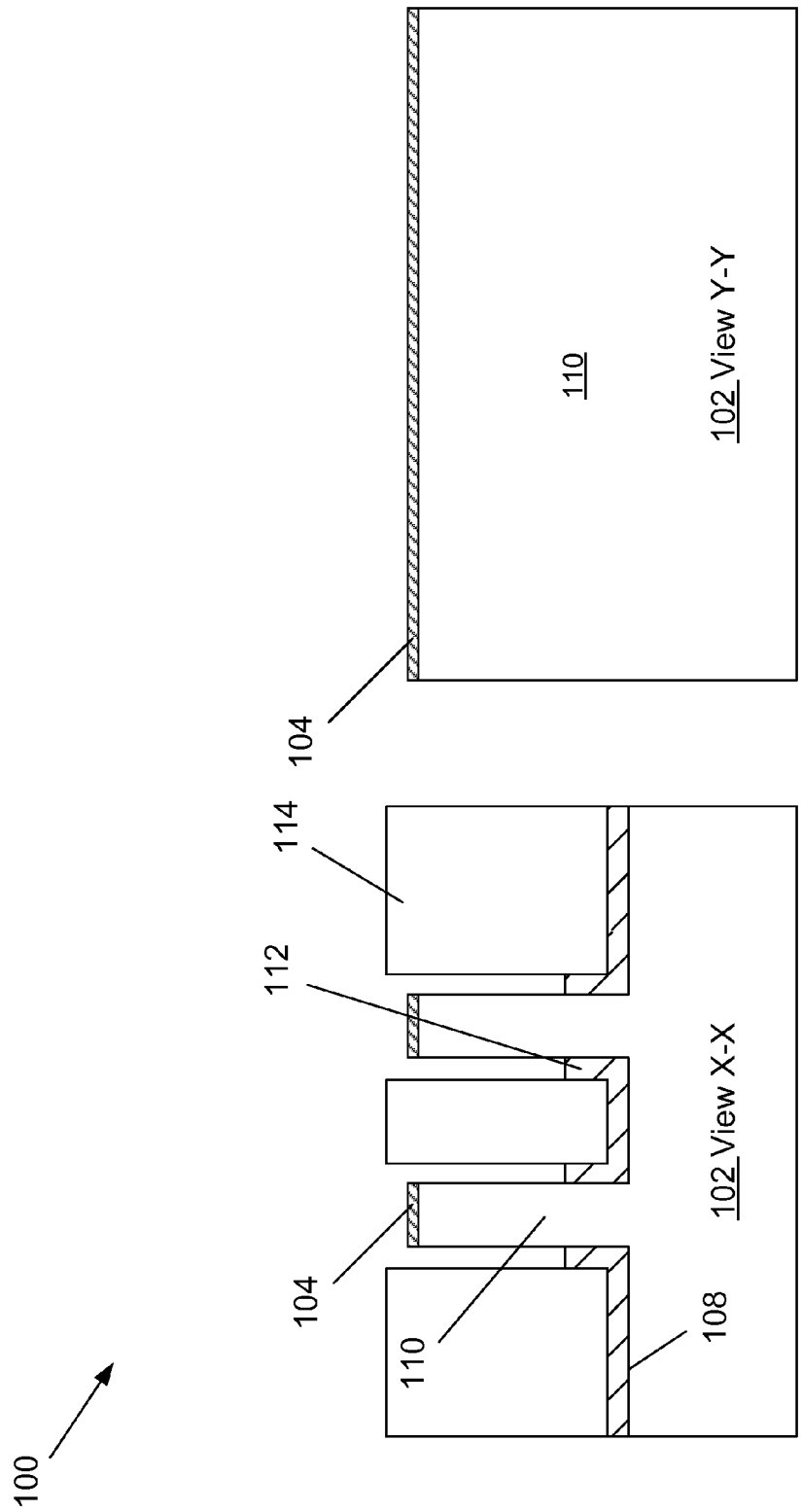

FIG. 2G depicts the device 100 after a recess etching process was performed to recess the liner layer 112 relative to the surrounding materials. This recessing process exposes the desired final height of the fin 110.

Figure 2H:
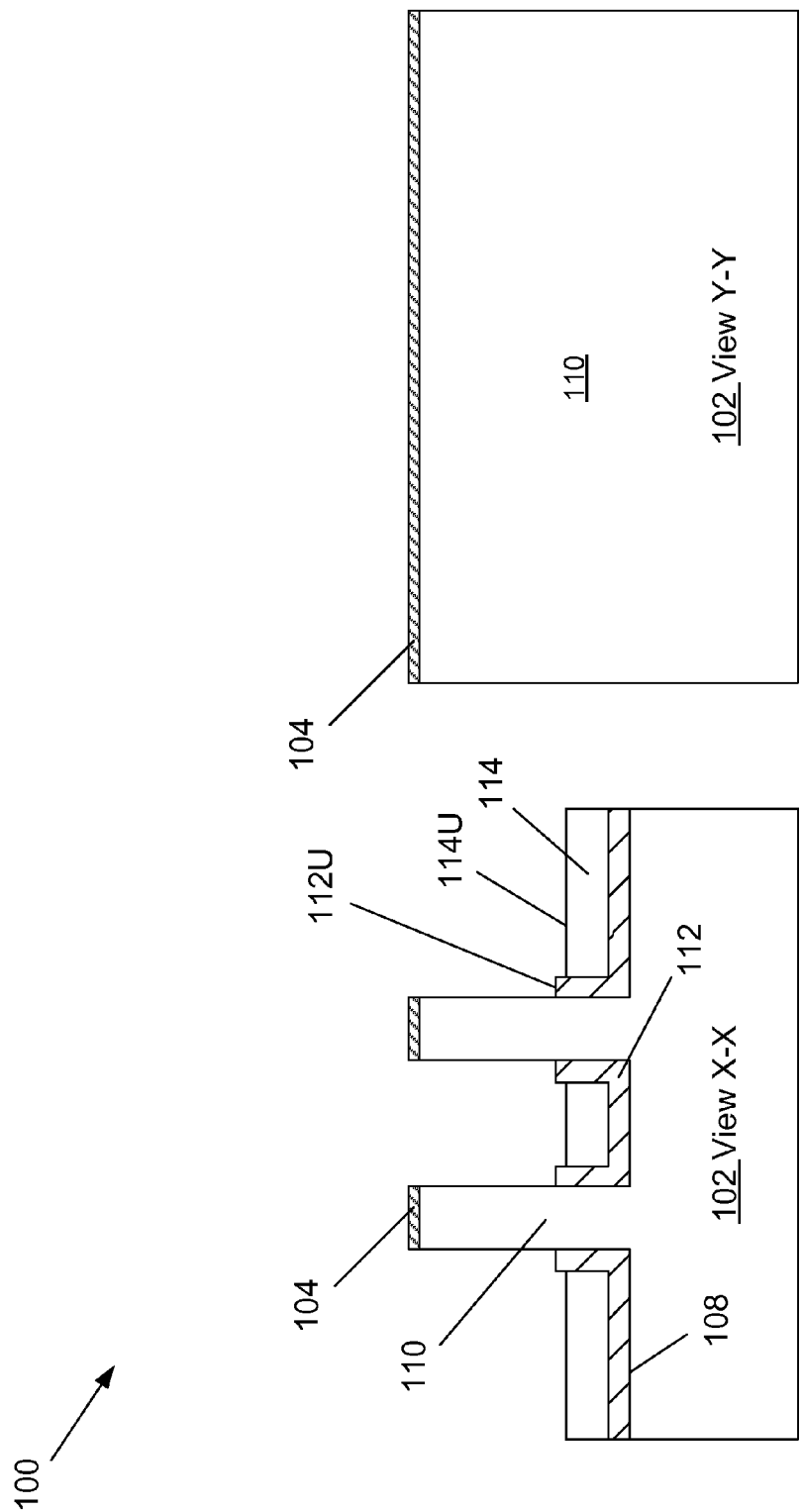

FIG. 2H depicts the device 100 after a recess etching process was performed to recess the layer of insulating material 114 relative to the surrounding materials. This recessing process should be performed such that the recessed surface 114U of the layer of insulating material 114 is positioned below the level of the upper surface 112U of the recessed liner layer 112. The difference in the height of the surfaces 114U and 112U may vary depending upon the particular application, e.g., 0-5 nm.

Figure 2I:
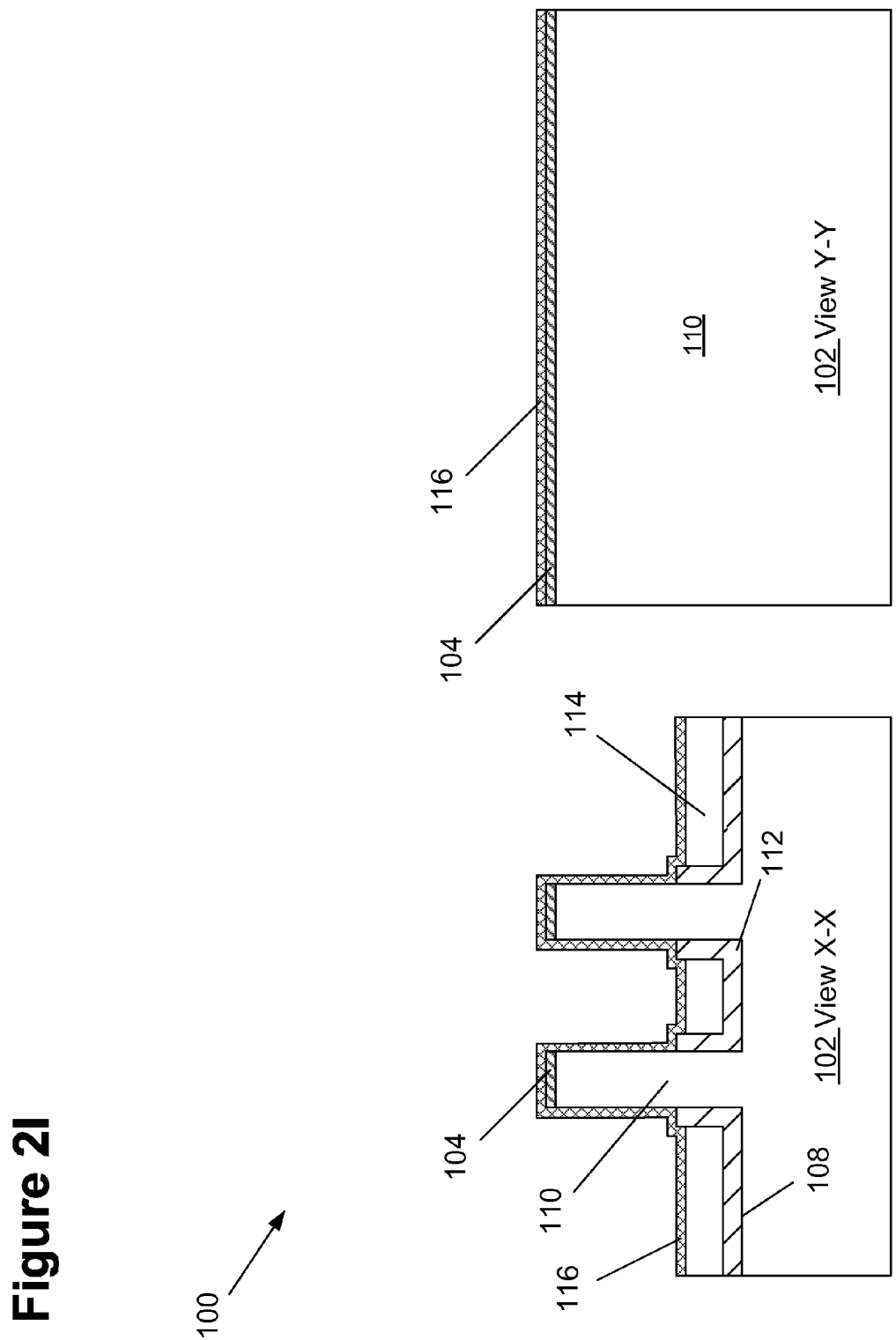

FIG. 2I depicts the device 100 after another etch stop layer 116 was deposited by performing a conformal deposition process, such as an ALD process. The etch stop layer 116 may be made of the same materials as that of the etch stop layer 104, although such a situation may not be required in all applications. The etch stop layer 116 may be relatively thin, e.g., 2-3 nm.

Figure 2J:
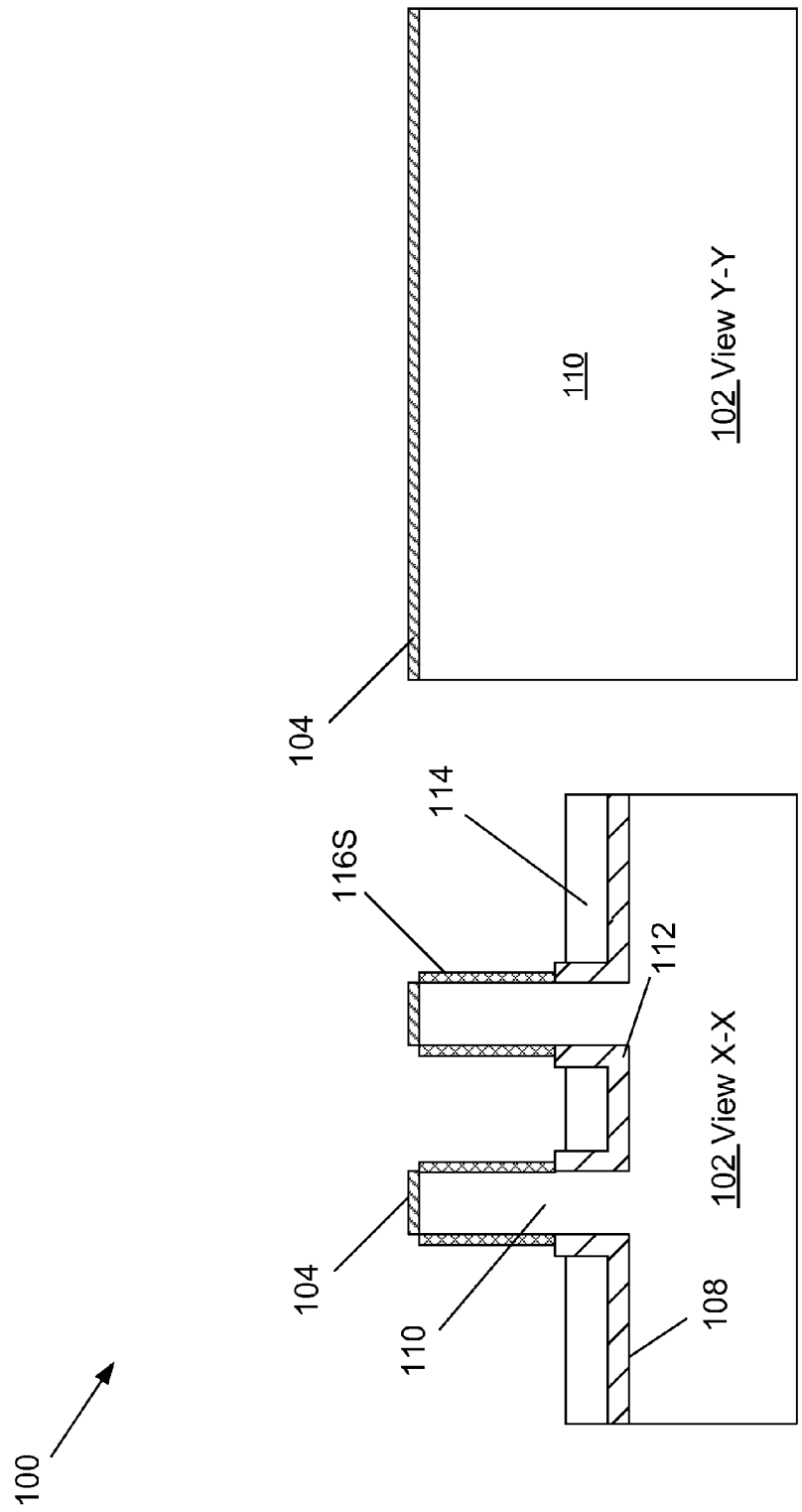

FIG. 2J depicts the device 100 after a timed, anisotropic etching process was performed to remove the horizontally positioned portions of the etch stop layer 116. The etching process results in the formation of protective sidewall spacers 116S on the sidewalls of the fins 110.

Figure 2K:
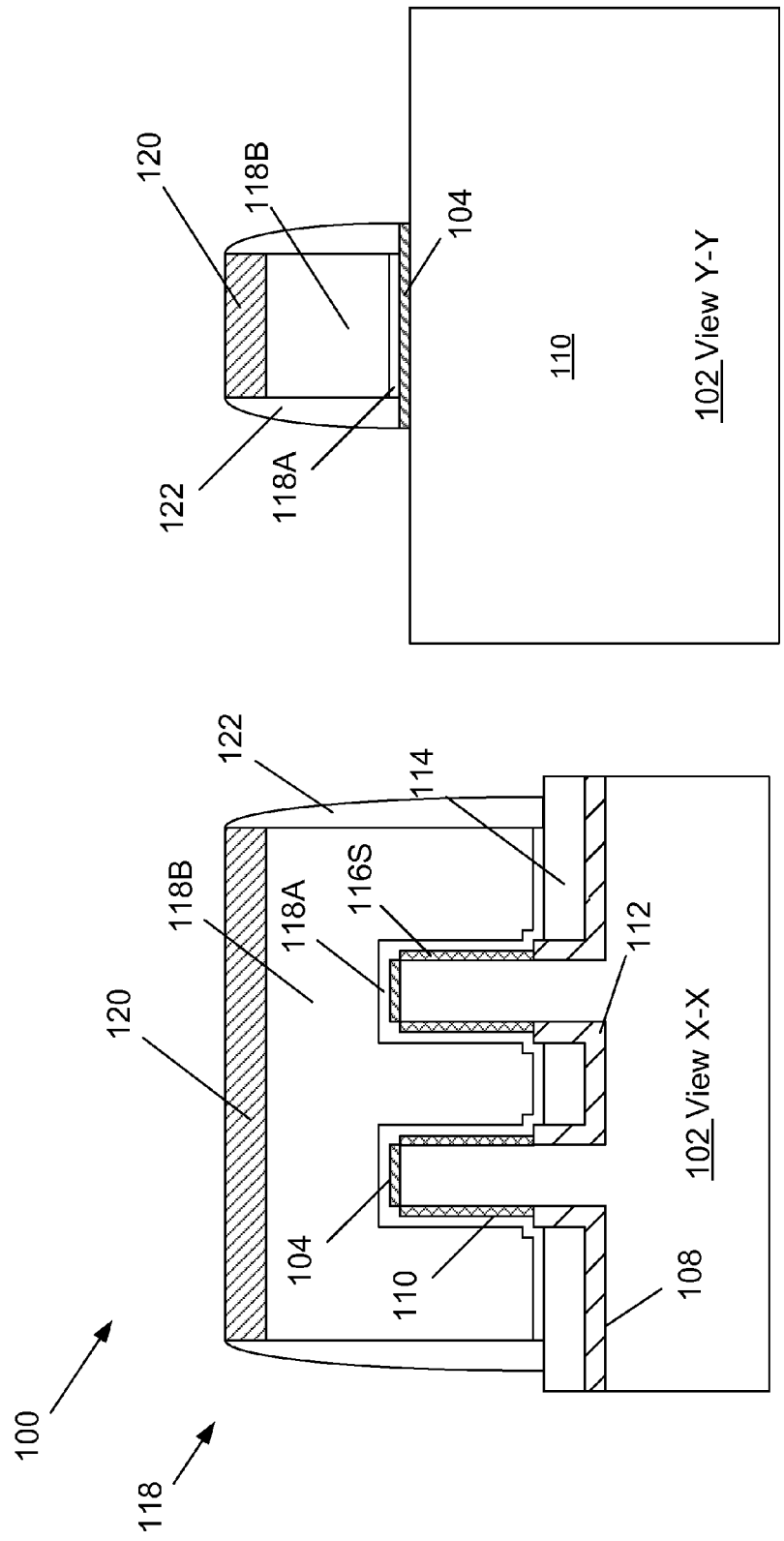

FIG. 2K depicts the device 100 after several process operations were performed. First, an illustrative sacrificial gate structure 118, gate cap layer 120 and sidewall spacers 122 were formed on the device 100. In this example, the sacrificial gate structure 118 includes a dummy gate insulation layer 118A (e.g., silicon dioxide) and a dummy or sacrificial gate electrode 118B comprised of, for example, polysilicon or amorphous silicon. The gate cap layer 120 and the sidewall spacers 122 may be comprised of a material such as silicon nitride. The gate structure 118 and the gate cap layer 120 may be formed by depositing the appropriate layers of material on the device and thereafter patterning those materials using traditional photolithography and etching techniques. The etch stop layer 104 may be used as an etch stop during the gate patterning techniques. After gate patterning is done, exposed portions of the etch stop layer 104 may be removed. Then, the sidewall spacers 122 may be formed adjacent the gate structure 118. The spacers 122 may be formed by depositing a layer of spacer material and thereafter performing an anisotropic etching process. At this point in the process flow, the materials 104 and 116 have been removed from the fins 110 in the source/drain regions of the device 100, i.e., in the areas laterally outside of the spacers 122.

FIG. 2L depicts the device 100 after an epi semiconductor material 124 was formed on the fin 110 in the source/drain regions of the device 100. The epi semiconductor material 124 may be made by performing a traditional epitaxial deposition process. In one illustrative embodiment, the epi semiconductor material 124 may be made of silicon or silicon/germanium ($S_xGe_{1-x}$), where the concentration of the germanium may also vary depending upon the particular application. Of course, the epi material 124 may not be formed in all applications. For example, a layer of insulating material (indicated with dashed line 125 in FIG. 2L only) may be formed in the source/drain regions of the device (hereinafter a source/drain layer of insulating material) without removing the portions of the fins positioned outside the spacers.

Figure 2M:
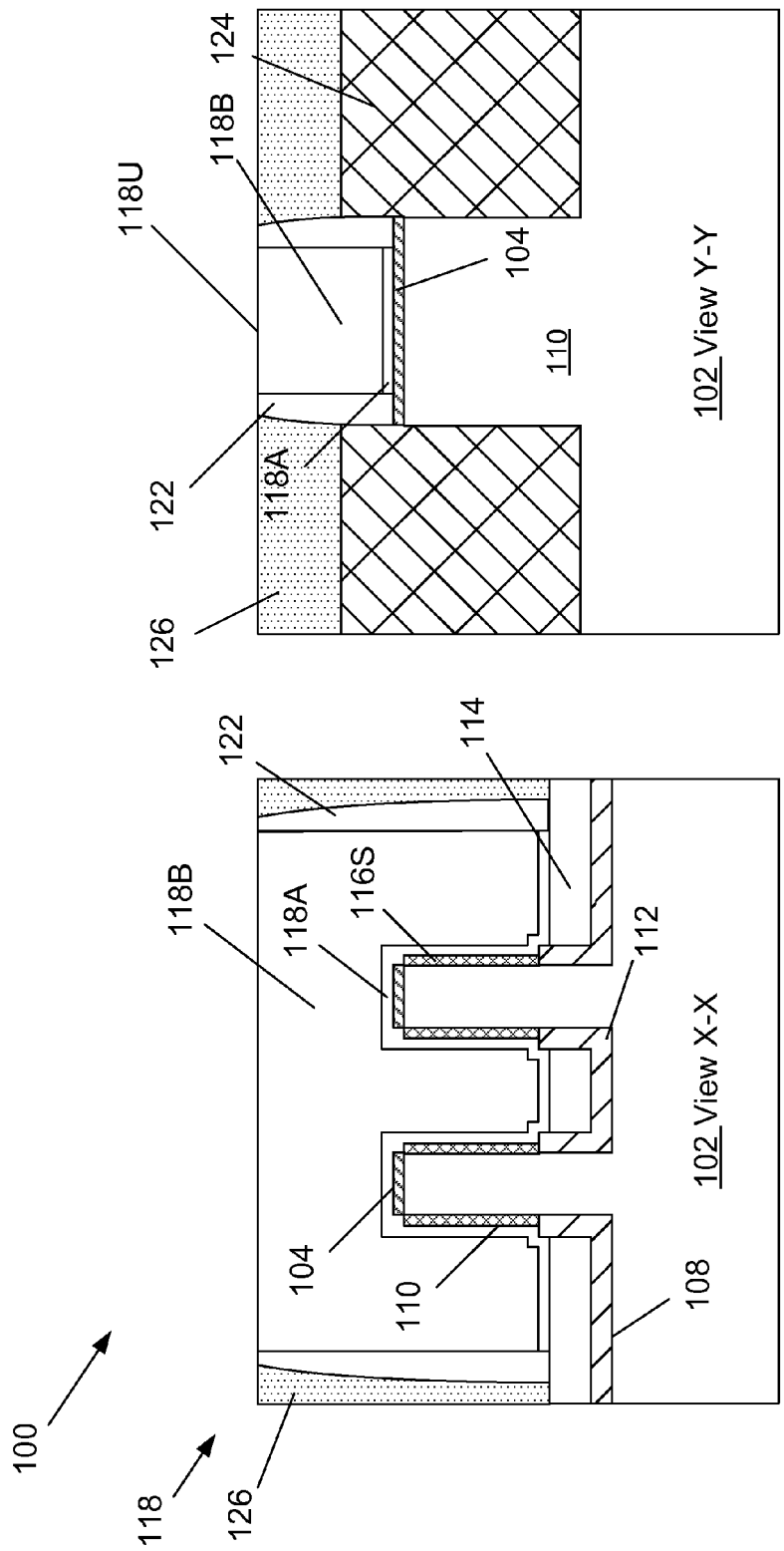

FIG. 2M depicts the device 100 after a layer of insulating material 126 was blanket-deposited on the device 100, and after one or more chemical mechanical polishing (CMP) processes were performed to thereby remove the gate cap layer 120 and expose the upper surface 118U of the sacrificial gate electrode 118 so that it can be removed. In one illustrative example, the layer of insulating material 126 may be a layer of silicon dioxide, an oxygen-rich silicon dioxide, etc., and it may be formed by performing a chemical vapor deposition (CVD) process.

Figure 2N:
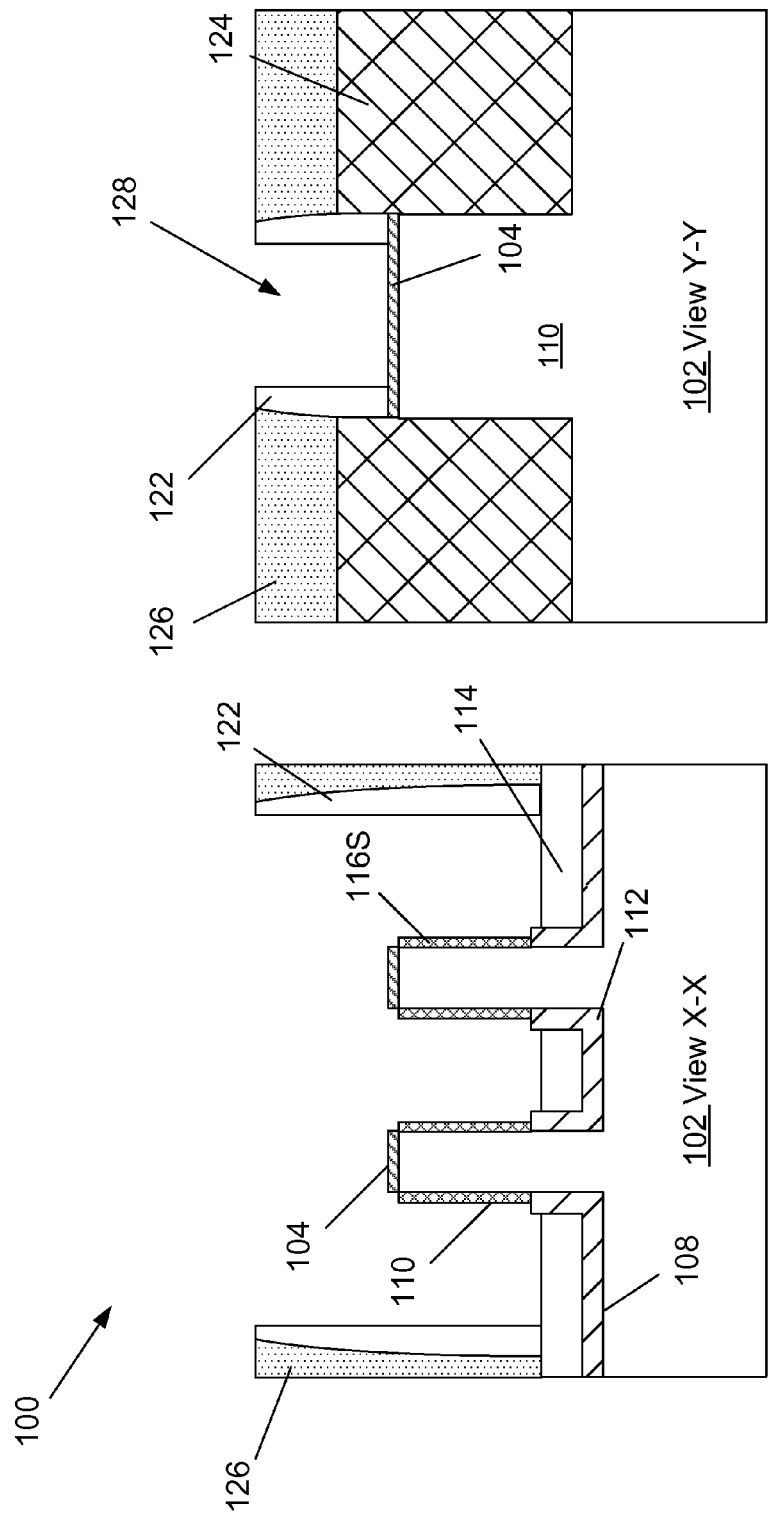

FIG. 2N depicts the device 100 after one or more etching processes were performed to remove the sacrificial gate structure 118 and thereby define a replacement gate cavity 128 where a replacement gate structure will eventually be formed for the device 100. During this etching process, the etch stop layer 104 within the gate cavity 128 may serve as an etch stop layer.

Figure 2O:
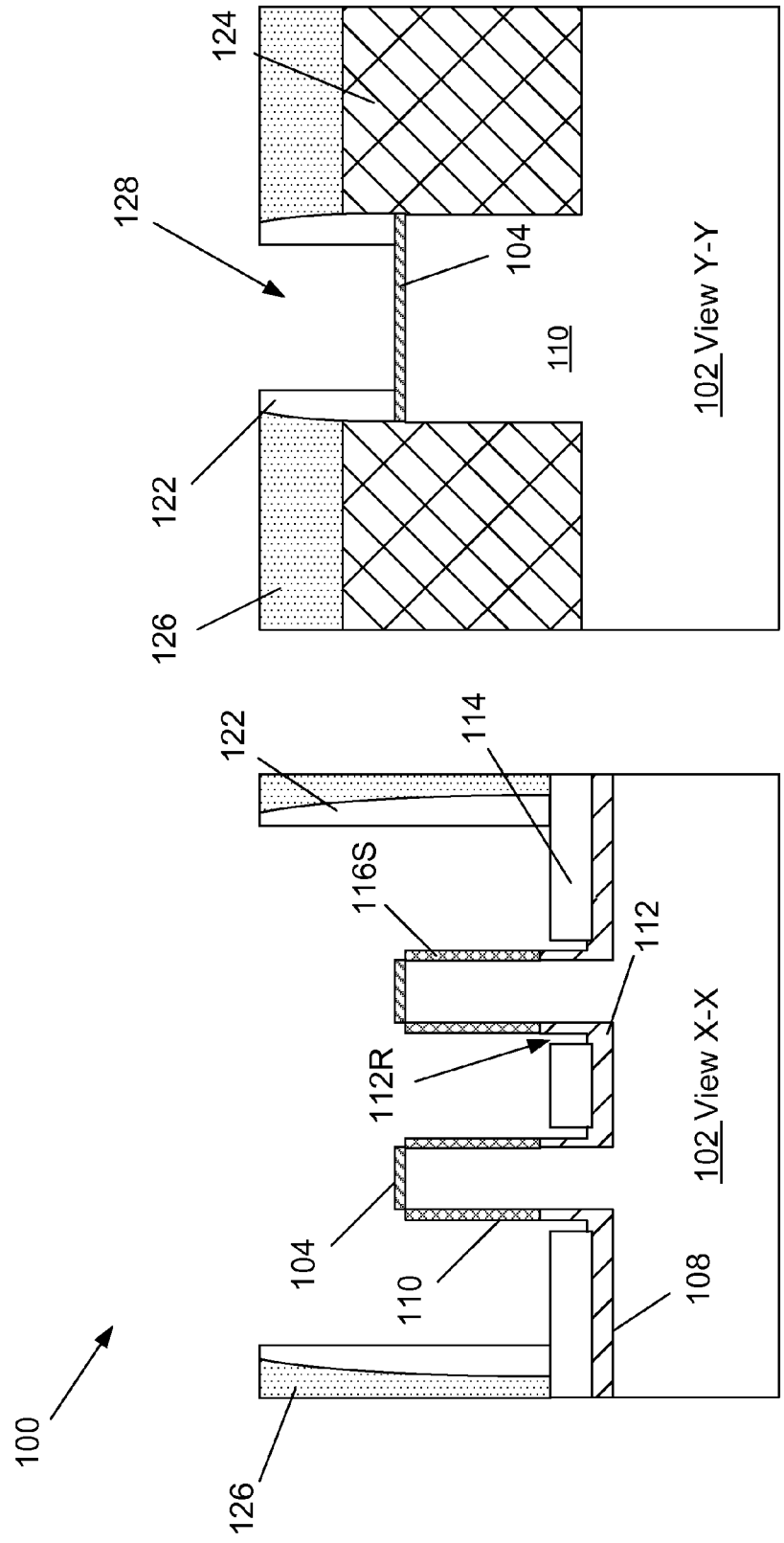

FIG. 2O depicts the device 100 after an anisotropic etching process was performed to remove portions 112R of the silicon nitride liner layer 112. Additionally, although not depicted in the attached drawings, an upper corner portion of the spacers 122 may be removed as a result of this process as well. By removing the upper corner portions of the spacers, the opening of the replacement gate cavity 128 is effectively widened, thereby making filling of the gate cavity 128 easier.

Figure 2P:
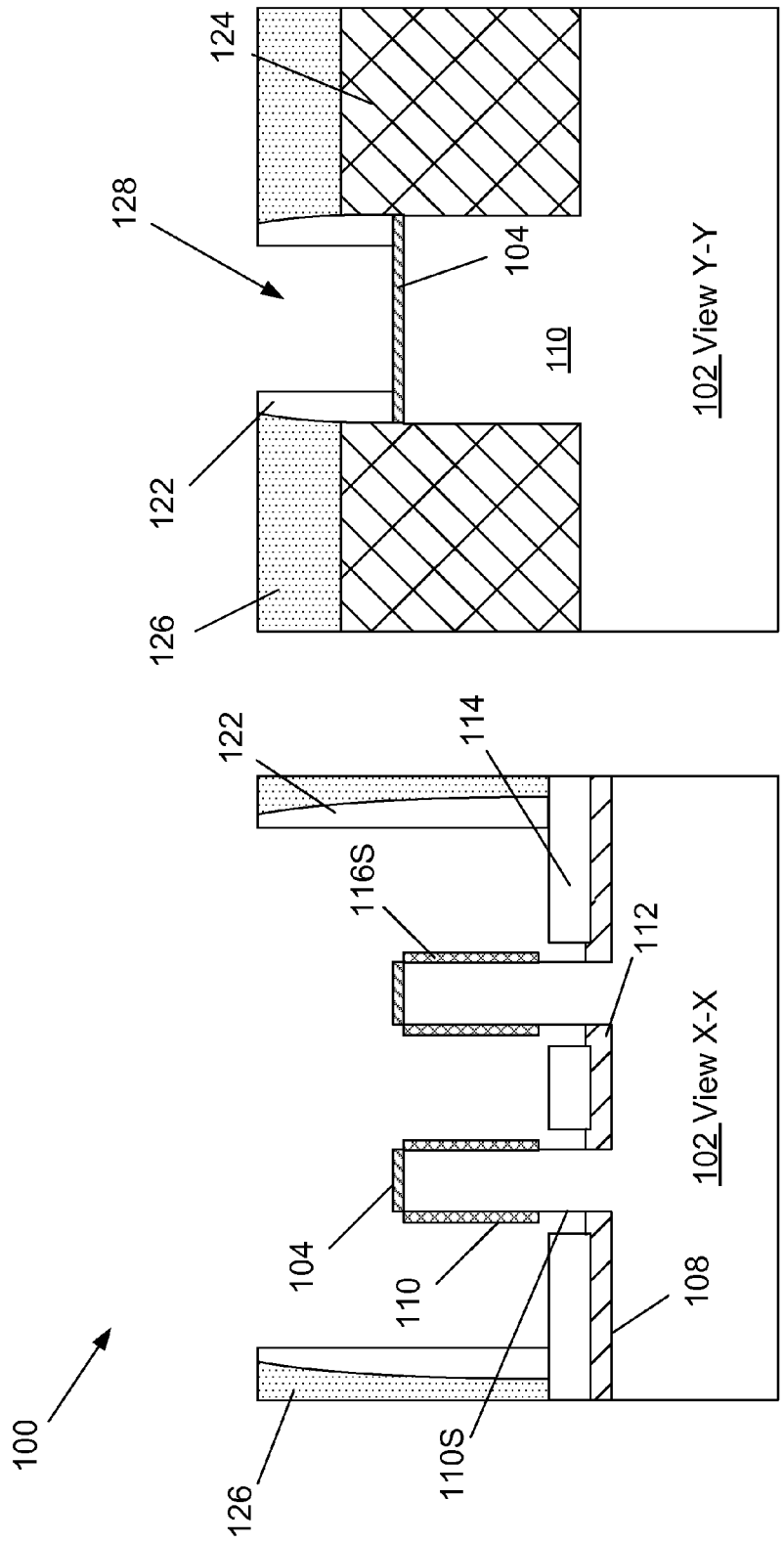

FIG. 2P depicts the device 100 after an isotropic etching process was performed to remove any residual portions of the silicon nitride liner layer 112. This etching process exposes portions of the sidewalls 110S of the initial fin structures 110 for further processing.

Figure 2Q:
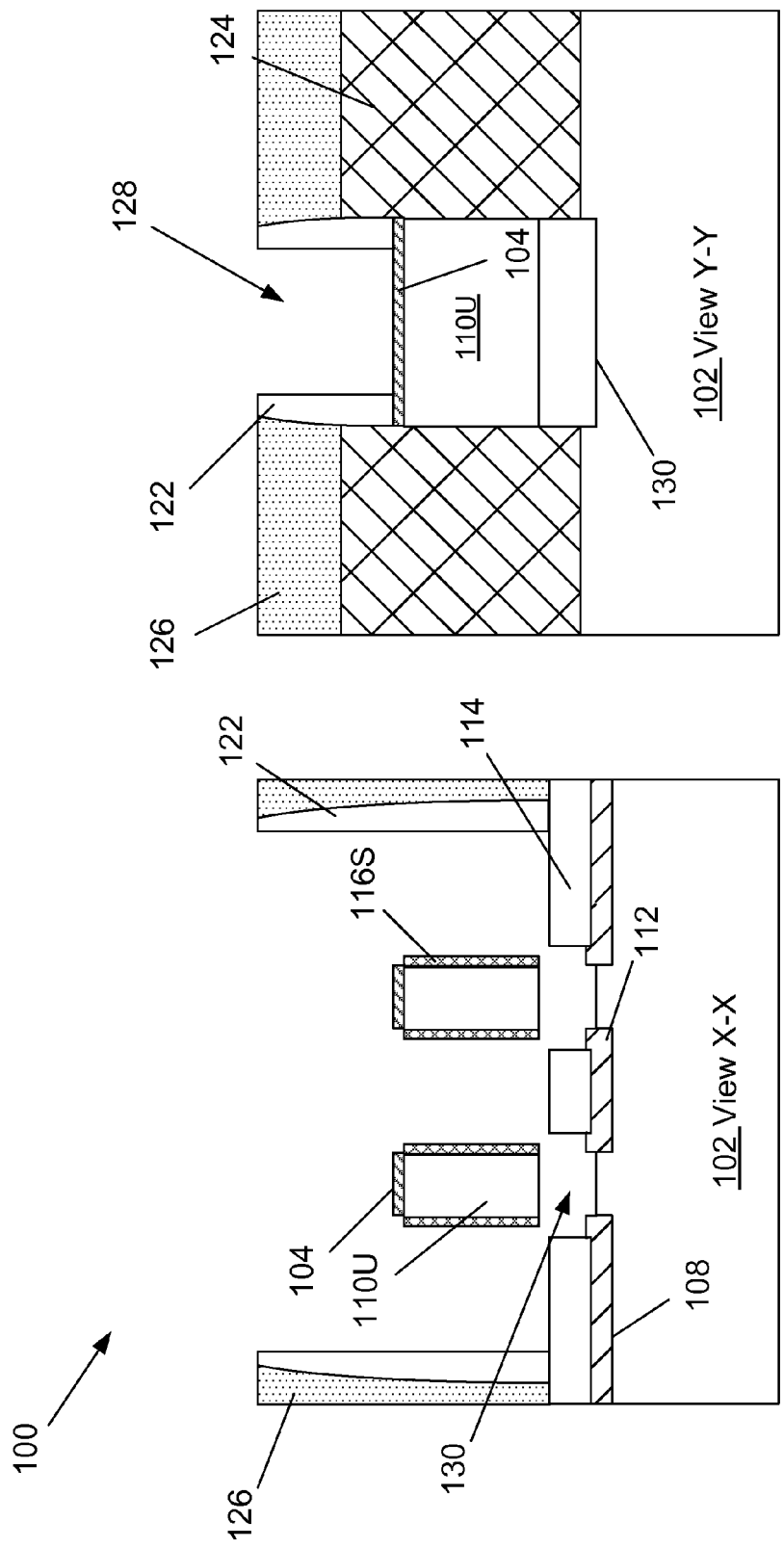

FIG. 2Q depicts the device 100 after an isotropic etching process was performed through the replacement gate cavity 128 to remove the portions of the initial fin structures 110 that are not protected by the etch stop layers 104, 116S and liner layer 112. This results in the formation of a channel cavity 130 for each of the fins 110 and defines the final fins 110U for the device 100. This etching process is also selective relative to the epi semiconductor material 124. The final fins 110U are anchored to the substrate 102 by the epi semiconductor material 124.

Figure 2R:
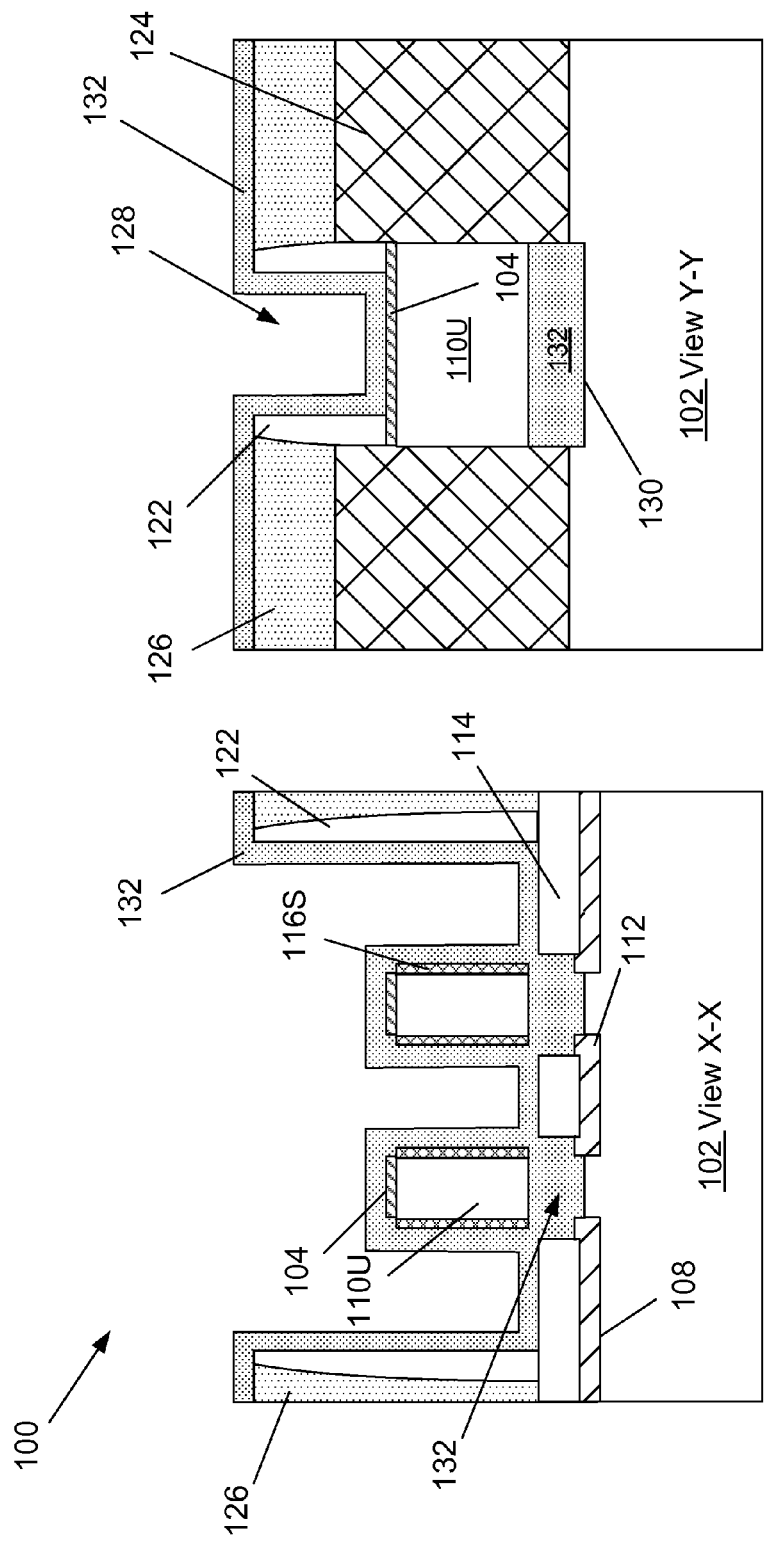

FIG. 2R depicts the device 100 after the channel cavity 130 was substantially filled with an insulating material 132, e.g., silicon dioxide. The insulating material 132 may be formed by performing an ALD process.

Figure 2S:
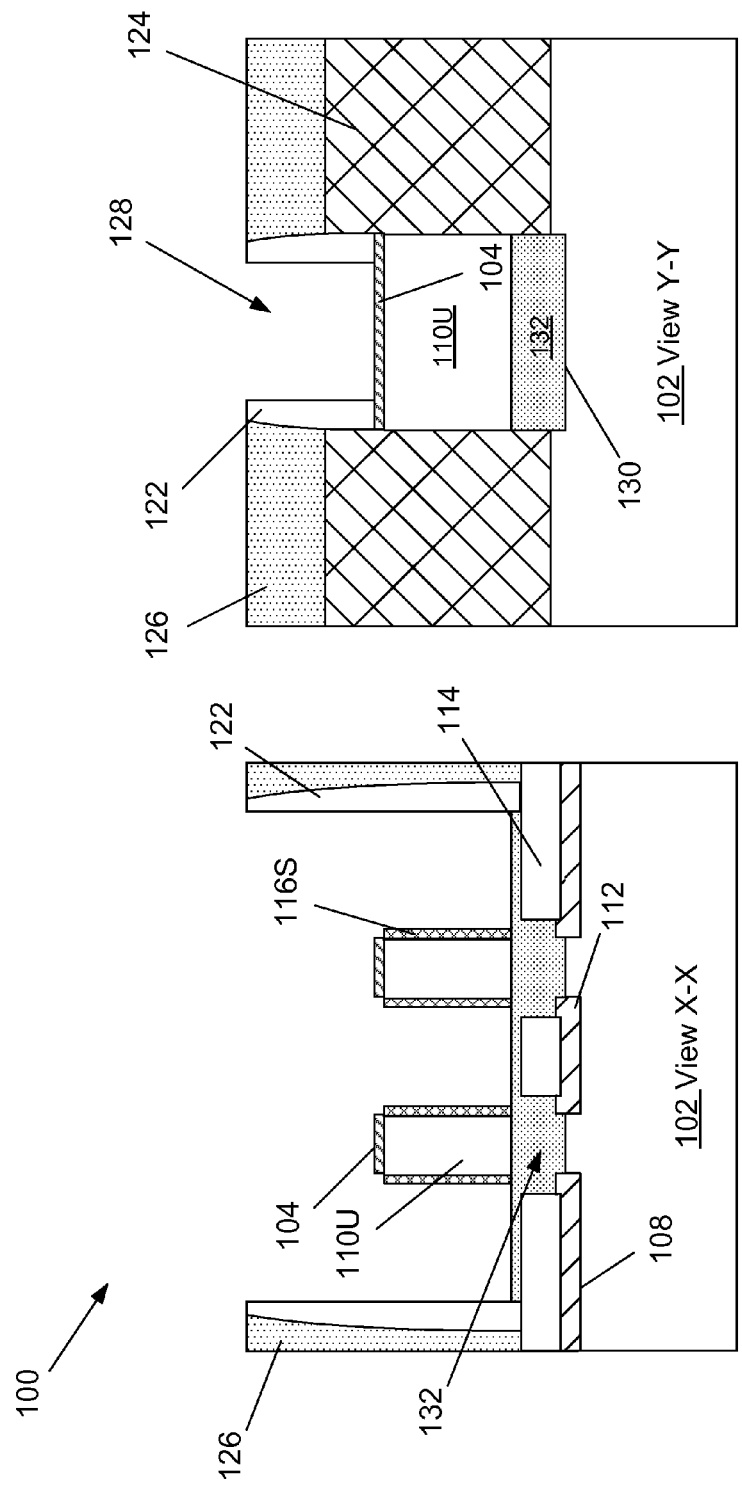

FIG. 2S depicts the device 100 after a recess etch-back etching process was performed through the gate cavity 128 to recess the upper surface of the insulating material 132 to the desired height level within the gate cavity 128. After this etching process is performed, the channel cavity 130 remains substantially filled with insulating material 132.

Figure 2T:
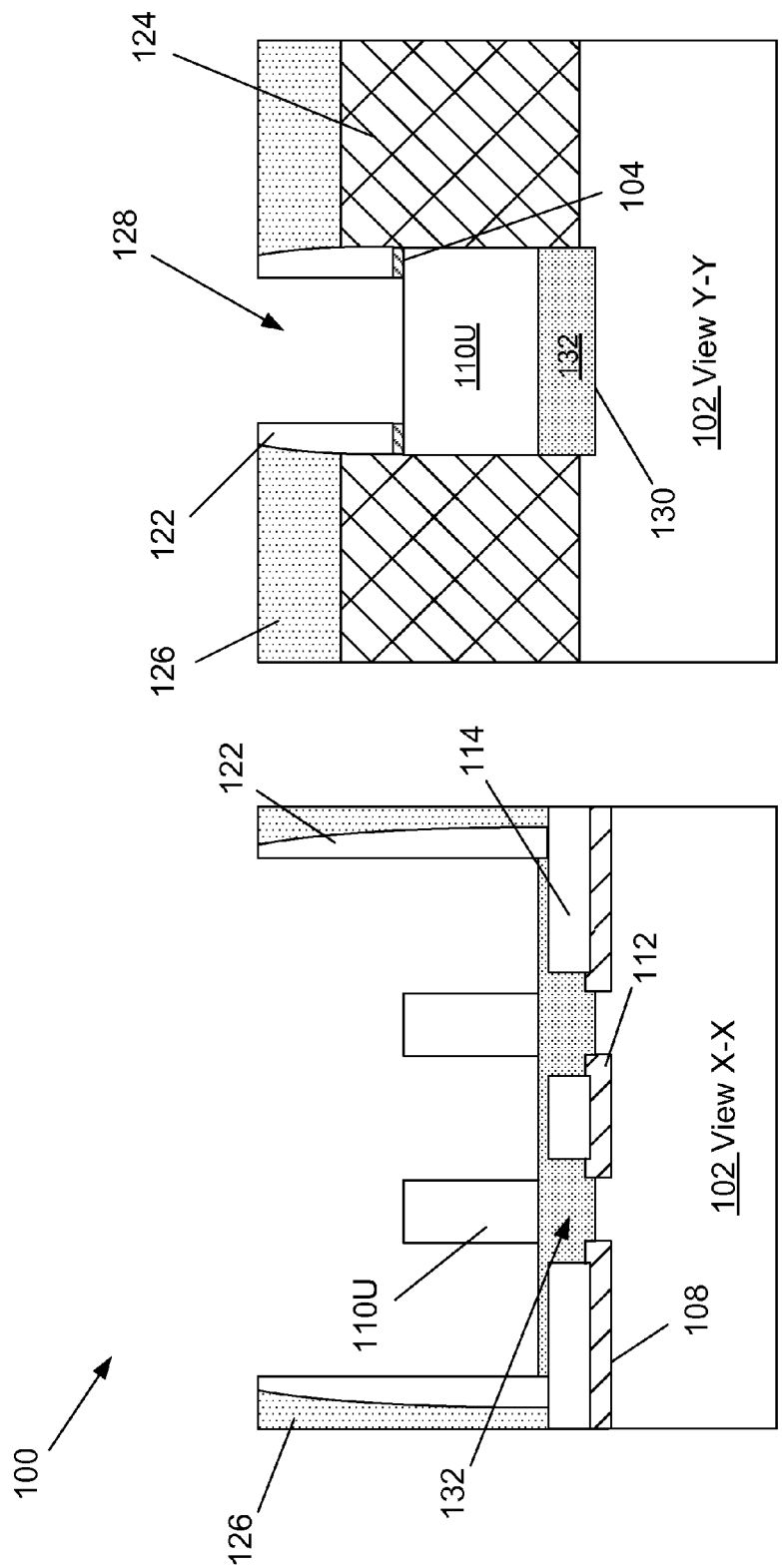

FIG. 2T depicts the device 100 after one or more etching processes were performed through the gate cavity 128 to remove any residual portions of the etch stop layers 104, 116S so as to thereby clear the final fin structures 110U of any unwanted materials.

FIG. 2U depicts the device 100 after several process operations were performed. First, several known processing operations were performed to form a schematically depicted replacement gate structure 140 in the gate cavity 128. The replacement gate structure 140 depicted herein is intended to be representative in nature of any type of gate structure that may be employed in manufacturing integrated circuit products using so-called gate-last (replacement-gate) manufacturing techniques. The replacement gate structure 140 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum. After the various layers of material that will be present in the replacement gate structure 140 are sequentially deposited in the gate cavity 128, one or more CMP processes are performed to remove excess portions of the gate materials positioned outside of the gate cavity 128 and above the layer of insulating material 126, as described in the background section of this application. Then, one or more etching processes were performed to remove upper portions of the various materials within the cavity 128 so as to form the replacement gate structure 140 and to form a recess above the replacement gate structure 140. Then, a gate cap 142 was formed in the recess above the recessed gate materials. The gate cap 142 is typically comprised of silicon nitride and it may be formed by depositing a layer of gate cap material so as to over-fill the recess formed in the gate cavity 128 above the replacement gate structure 140 and thereafter performing a CMP process to remove excess portions of the gate cap material layer positioned above the surface of the layer of insulating material 126. The gate cap 142 is formed so as to protect the underlying gate materials during subsequent processing operations. At this point, traditional manufacturing operations may be performed to complete the fabrication of the illustrative FinFET device 100, e.g., contact formation, formation of metallization layers, etc.

With continuing reference to FIG. 2U, according to one illustrative aspect of the various inventions disclosed herein, the insulating material 132 within the channel cavity 130 has a top surface 132T that abuts and engages the bottom surface of the final fin structure 110U and a bottom surface 132B that abuts and engages a portion of the substrate 102. The side surfaces 132S of the insulating material within the fin cavity 130 may only abut the epi material 124 or they may abut both the epi material 124 and a portion of the substrate 102, as depicted in FIG. 2U. In the case where the epi material 124 is not formed, the side surfaces of the insulating material within the fin cavity 130 may abut insulation material 125 (see FIG. 2L) formed in the source/drain regions of the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device, the method comprising:
    forming an initial fin structure from a semiconductor substrate material, said initial fin structure having sidewalls;
    covering a top surface and a portion of said sidewalls of said initial fin structure with etch stop material;
    after forming said etch stop material, forming a sacrificial gate structure above and around said initial fin structure;
    forming a sidewall spacer adjacent said sacrificial gate structure;
    performing at least one process operation to remove said sacrificial gate structure and thereby define a replacement gate cavity, wherein said etch stop material on said initial fin structure remains positioned on said initial fin structure while said sacrificial gate structure is removed;
    performing at least one etching process through said replacement gate cavity to remove a portion of said initial fin structure positioned under said replacement gate cavity that is not covered by said etch stop material so as to thereby define a final fin structure and a channel cavity positioned below said final fin structure; and
    substantially filling said channel cavity with an insulating material.

2. The method of claim 1, wherein said insulating material is silicon dioxide.

3. The method of claim 1, wherein substantially filling said channel cavity with said insulating material comprises forming said insulating material so as to overfill said channel cavity and thereafter performing an etch-back etching process.

4. The method of claim 1, wherein covering said top surface and said portion of said sidewalls of said initial fin structure with etch stop material comprises depositing two separate layers of material.

5. The method of claim 1, further comprising:
    performing at least one process operation through said replacement gate cavity to remove substantially all of said etch stop material; and
    forming a replacement gate structure in said replacement gate cavity.

6. The method of claim 5, wherein said replacement gate structure comprises a gate insulation layer comprised of a high-k insulating material and a gate electrode comprised of at least one layer of metal.

7. The method of claim 1, wherein, prior to performing said at least one process operation to remove said sacrificial gate structure, the method further comprises performing an epitaxial deposition process to form an epi semiconductor material on said initial fin structure that is positioned laterally outside of said sidewall spacer.

8. The method of claim 1, wherein said etch stop material remains positioned on said final fin structure while said at least one etching process is performed to define said final fin structure and said channel cavity.

9. A method of forming a FinFET device, the method comprising:
    forming an initial fin structure from a semiconductor substrate material, said initial fin structure having sidewalls;
    covering a top surface and a portion of said sidewalls of said initial fin structure with etch stop material;
    after forming said etch stop material, forming a sacrificial gate structure above and around said initial fin structure;
    forming a sidewall spacer adjacent said sacrificial gate structure;
    after forming said sidewall spacer, performing an epitaxial deposition process to form an epi semiconductor material on said initial fin structure that is positioned laterally outside of said sidewall spacer;
    after forming said epi semiconductor material, performing at least one process operation to remove said sacrificial gate structure and thereby define a replacement gate cavity, wherein said etch stop material on said initial fin structure remains positioned on said initial fin structure while said sacrificial gate structure is removed;
    performing at least one etching process through said replacement gate cavity to remove a portion of said initial fin structure positioned under said replacement gate cavity that is not covered by said etch stop material so as to thereby define a final fin structure and a channel cavity positioned below said final fin structure, wherein said etch stop material remains positioned on said final fin structure while said at least one etching process is performed to define said final fin structure and said channel cavity; and
    substantially filling said channel cavity with an insulating material.

10. The method of claim 9, wherein said insulating material is silicon dioxide.

11. The method of claim 9, wherein substantially filling said channel cavity with said insulating material comprises forming said insulating material so as to overfill said channel cavity and thereafter performing an etch-back etching process.

12. The method of claim 9, wherein covering said top surface and said portion of said sidewalls of said initial fin structure with etch stop material comprises depositing two separate layers of material.

13. The method of claim 9, further comprising:
    performing at least one process operation through said replacement gate cavity to remove substantially all of said etch stop material; and
    forming a replacement gate structure in said replacement gate cavity.

14. The method of claim 9, where said etch stop material remains positioned on said final fin structure while said at least one etching process is performed to define said final fin structure and said channel cavity.

15. A FinFET device comprised of source/drain regions, comprising:
    a substrate comprised of a semiconductor material;
    a gate structure positioned above said substrate;
    sidewall spacers positioned adjacent said gate structure;
    an epi semiconductor material positioned in said source/drain regions of said FinFET device laterally outside of said sidewall spacers;
    a fin that extends laterally under said gate structure and said sidewall spacers in a gate length direction of said FinFET device, wherein end surfaces of said fin abut and engage said epi semiconductor material, and
    an insulating material that is positioned below said fin, above said substrate and laterally between said epi semiconductor material, wherein a top surface of said insulating material abuts and engages a bottom surface of said fin, a bottom surface of said insulating material abuts and engages said substrate, and side surfaces of said insulating material abut and engage at least a portion of said epi semiconductor material.

16. The device of claim 15, wherein said insulating material is silicon dioxide.

17. The device of claim 16, wherein said substrate is silicon and said epi semiconductor material is silicon or silicon/germanium.

18. A FinFET device comprised of source/drain regions, comprising:
    a substrate comprised of a semiconductor material;
    a gate structure positioned above said substrate;
    sidewall spacers positioned adjacent said gate structure;
    a layer of source/drain insulating material positioned above said source/drain regions of said FinFET device laterally outside of said sidewall spacers;
    a fin that extends laterally under said gate structure and said sidewall spacers in a gate length direction of said FinFET device, wherein end surfaces of said fin abut and engage said source/drain layer of insulating material; and
    an insulating material that is positioned below said fin, above said substrate and laterally between said source/drain layer of insulating material, wherein a top surface of said insulating material abuts and engages a bottom surface of said fin, a bottom surface of said insulating material abuts and engages said substrate, and side surfaces of said insulating material abut and engage at least a portion of said source/drain layer of insulating material.

* * * * *